(12) United States Patent
Kanakasabapathy et al.

(10) Patent No.: US 11,987,876 B2
(45) Date of Patent: May 21, 2024

(54) CHAMFER-LESS VIA INTEGRATION SCHEME

(71) Applicant: Lam Research Corporation, Fremont, CA (US)

(72) Inventors: Sivananda Krishnan Kanakasabapathy, Pleasanton, CA (US); Hui-Jung Wu, Pleasanton, CA (US); Richard Wise, Los Gatos, CA (US); Arpan Mahorowala, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 884 days.

(21) Appl. No.: 16/982,489

(22) PCT Filed: Mar. 14, 2019

(86) PCT No.: PCT/US2019/022319
§ 371 (c)(1),
(2) Date: Sep. 18, 2020

(87) PCT Pub. No.: WO2019/182872
PCT Pub. Date: Sep. 26, 2019

(65) Prior Publication Data
US 2021/0017643 A1    Jan. 21, 2021

Related U.S. Application Data

(60) Provisional application No. 62/644,783, filed on Mar. 19, 2018.

(51) Int. Cl.
*C23C 16/04*    (2006.01)
*C23C 16/40*    (2006.01)
(Continued)

(52) U.S. Cl.
CPC .......... *C23C 16/045* (2013.01); *C23C 16/407* (2013.01); *C23C 16/45553* (2013.01);
(Continued)

(58) Field of Classification Search
CPC ............... C23C 16/045; C23C 16/407; C23C 16/45553; H01L 21/31122;
(Continued)

(56) References Cited

U.S. PATENT DOCUMENTS 4,544,444 A    10/1985   Chang
4,708,766 A    11/1987   Hynecek
(Continued)

FOREIGN PATENT DOCUMENTS

CN    104752199 A    7/2015
DE    4337309 A1    3/1995
(Continued)

OTHER PUBLICATIONS

U.S. Office Action, dated Feb. 9, 2017, issued in U.S. Appl. No. 15/195,348.
(Continued)

*Primary Examiner* — Syed I Gheyas
(74) *Attorney, Agent, or Firm* — Weaver Austin Villeneuve & Sampson LLP

(57) ABSTRACT

Methods and apparatuses for processing semiconductor substrates in an integration scheme to form chamferless vias are provided herein. Methods include bifurcating etching of dielectric by depositing a conformal removable sealant layer having properties for selective removal relative to dielectric material without damaging dielectric material. Some methods include forming an ashable conformal sealant layer. Methods also include forming hard masks including a Group
(Continued)

IV metal and removing conformal removable sealant layers and hard masks in one operation using same etching chemistries.

27 Claims, 7 Drawing Sheets

(51) Int. Cl.
    *C23C 16/455*     (2006.01)
    *H01L 21/311*     (2006.01)
    *H01L 21/67*     (2006.01)
    *H01L 21/768*     (2006.01)

(52) U.S. Cl.
    CPC .. *H01L 21/31122* (2013.01); *H01L 21/31144* (2013.01); *H01L 21/67023* (2013.01); *H01L 21/67069* (2013.01); *H01L 21/76808* (2013.01)

(58) Field of Classification Search
    CPC ......... H01L 21/31144; H01L 21/67023; H01L 21/67069; H01L 21/76808
    See application file for complete search history.

(56) References Cited

U.S. PATENT DOCUMENTS

| | | | |
|---|---|---|---|
| 4,778,562 A | 10/1988 | Chang | |
| 4,878,993 A | 11/1989 | Rossi et al. | |
| 5,032,221 A | 7/1991 | Roselle et al. | |
| 5,079,178 A | 1/1992 | Chouan et al. | |
| 5,171,401 A | 12/1992 | Roselle | |
| 5,286,337 A | 2/1994 | Tsou | |
| 5,318,664 A | 6/1994 | Saia et al. | |
| 5,399,464 A | 3/1995 | Lee | |
| 5,607,602 A | 3/1997 | Su et al. | |
| 5,667,631 A | 9/1997 | Holland et al. | |
| 5,723,366 A | 3/1998 | Suzuki et al. | |
| 6,036,876 A | 3/2000 | Chen et al. | |
| 6,180,438 B1 | 1/2001 | Deane et al. | |
| 6,326,301 B1 * | 12/2001 | Venkatesan ....... H01L 21/76834 438/618 |
| 6,368,978 B1 | 4/2002 | Kumar et al. | |
| 6,416,822 B1 | 7/2002 | Chiang et al. | |
| 6,428,859 B1 | 8/2002 | Chiang et al. | |
| 6,617,253 B1 | 9/2003 | Chu et al. | |
| 6,833,306 B2 | 12/2004 | Lyding et al. | |
| 7,459,732 B2 | 12/2008 | Fleischer et al. | |
| 8,163,094 B1 | 4/2012 | Greer et al. | |
| 8,435,608 B1 | 5/2013 | Subramonium et al. | |
| 8,747,964 B2 | 6/2014 | Park et al. | |
| 8,901,016 B2 | 12/2014 | Ha et al. | |
| 8,969,110 B2 | 3/2015 | Choi | |
| 9,269,590 B2 | 2/2016 | Luere et al. | |
| 9,287,113 B2 | 3/2016 | Kang et al. | |
| 9,390,909 B2 | 7/2016 | Pasquale et al. | |
| 9,437,443 B2 | 9/2016 | Brink et al. | |
| 9,515,156 B2 | 12/2016 | Besser et al. | |
| 9,523,148 B1 | 12/2016 | Pore et al. | |
| 9,640,396 B2 | 5/2017 | Lin et al. | |
| 9,824,893 B1 | 11/2017 | Smith et al. | |
| 9,892,917 B2 | 2/2018 | Swaminathan et al. | |
| 9,996,004 B2 | 6/2018 | Smith et al. | |
| 10,546,748 B2 | 1/2020 | Yu et al. | |
| 10,665,501 B2 | 5/2020 | Rainville et al. | |
| 11,031,245 B2 | 6/2021 | Smith et al. | |
| 11,088,019 B2 | 8/2021 | Van Cleemput et al. | |
| 11,183,383 B2 | 11/2021 | Smith et al. | |
| 11,322,351 B2 | 5/2022 | Yu et al. | |
| 11,355,353 B2 | 6/2022 | Yu et al. | |
| 11,551,938 B2 | 1/2023 | Heo et al. | |
| 11,637,037 B2 | 4/2023 | Van Cleemput et al. | |
| 11,784,047 B2 | 10/2023 | Smith et al. | |
| 11,848,212 B2 | 12/2023 | Heo et al. | |
| 2001/0008227 A1 | 7/2001 | Sadamoto et al. | |
| 2001/0018252 A1 | 8/2001 | Park et al. | |
| 2001/0030860 A1 | 10/2001 | Kimura et al. | |
| 2002/0044230 A1 | 4/2002 | Yamazaki et al. | |
| 2002/0113271 A1 | 8/2002 | Noguchi et al. | |
| 2002/0134425 A1 | 9/2002 | Yamamoto et al. | |
| 2002/0185466 A1 | 12/2002 | Furuta et al. | |
| 2003/0232504 A1 | 12/2003 | Eppler et al. | |
| 2004/0033698 A1 | 2/2004 | Lee et al. | |
| 2005/0112881 A1 | 5/2005 | Prakash et al. | |
| 2005/0167050 A1 | 8/2005 | Oikawa | |
| 2006/0072084 A1 | 4/2006 | Van Herpen et al. | |
| 2006/0073706 A1 | 4/2006 | Li et al. | |
| 2006/0148118 A1 | 7/2006 | Hsiung et al. | |
| 2006/0175558 A1 | 8/2006 | Bakker et al. | |
| 2006/0270209 A1 | 11/2006 | Mitsui et al. | |
| 2007/0040999 A1 | 2/2007 | Wilhelmus Van Herpen et al. | |
| 2007/0062557 A1 | 3/2007 | Rakhimova et al. | |
| 2007/0069160 A1 | 3/2007 | Banine et al. | |
| 2007/0134938 A1 * | 6/2007 | Kozuka ............ H01L 21/31122 438/778 |
| 2008/0061030 A1 | 3/2008 | Liu et al. | |
| 2008/0210660 A1 | 9/2008 | Stockum et al. | |
| 2008/0286448 A1 | 11/2008 | Elam et al. | |
| 2008/0286964 A1 * | 11/2008 | Hotta ...................... H01L 24/11 257/E23.15 |
| 2009/0011589 A1 | 1/2009 | Jeon et al. | |
| 2009/0017616 A1 | 1/2009 | Grunow et al. | |
| 2009/0145879 A1 | 6/2009 | Fairbairn et al. | |
| 2009/0233425 A1 | 9/2009 | Furuno et al. | |
| 2010/0099046 A1 | 4/2010 | Kim et al. | |
| 2010/0120247 A1 | 5/2010 | Park | |
| 2010/0159639 A1 | 6/2010 | Sakata | |
| 2010/0195033 A1 | 8/2010 | Takayama et al. | |
| 2011/0121378 A1 | 5/2011 | Ahn et al. | |
| 2011/0198627 A1 | 8/2011 | Maindron et al. | |
| 2011/0306214 A1 | 12/2011 | Zin | |
| 2012/0027937 A1 | 2/2012 | Gordon et al. | |
| 2012/0046421 A1 | 2/2012 | Darling et al. | |
| 2012/0115250 A1 | 5/2012 | Ariga et al. | |
| 2012/0193632 A1 | 8/2012 | Toriumi | |
| 2013/0161625 A1 | 6/2013 | Ku et al. | |
| 2013/0273733 A1 | 10/2013 | Tang et al. | |
| 2013/0309871 A1 | 11/2013 | DeVilliers | |
| 2014/0004707 A1 | 1/2014 | Thedjoisworo et al. | |
| 2014/0060574 A1 | 3/2014 | Wyse et al. | |
| 2014/0167040 A1 | 6/2014 | Lee et al. | |
| 2014/0308812 A1 | 10/2014 | Arghavani et al. | |
| 2014/0367833 A1 | 12/2014 | Brink et al. | |
| 2015/0000737 A1 | 1/2015 | Miyake et al. | |
| 2015/0122497 A1 | 5/2015 | Donaldson | |
| 2015/0126042 A1 | 5/2015 | Pasquale et al. | |
| 2015/0140726 A1 | 5/2015 | Honda et al. | |
| 2015/0162416 A1 | 6/2015 | Chang et al. | |
| 2015/0179414 A1 | 6/2015 | Xiao et al. | |
| 2015/0214094 A1 | 7/2015 | Jezewski et al. | |
| 2015/0221541 A1 | 8/2015 | Nemani et al. | |
| 2015/0243661 A1 | 8/2015 | Matsumoto | |
| 2015/0247238 A1 | 9/2015 | Pasquale et al. | |
| 2015/0287612 A1 | 10/2015 | Luere et al. | |
| 2015/0318181 A1 | 11/2015 | Cantone et al. | |
| 2016/0111374 A1 | 4/2016 | Brink et al. | |
| 2016/0111515 A1 | 4/2016 | Besser et al. | |
| 2016/0116839 A1 | 4/2016 | Meyers et al. | |
| 2016/0148818 A1 * | 5/2016 | Dobashi ............ H01L 21/31111 438/748 |
| 2016/0195812 A1 | 7/2016 | Huang et al. | |
| 2016/0203982 A1 | 7/2016 | Lin et al. | |
| 2016/0216606 A1 | 7/2016 | Meyers et al. | |
| 2016/0293405 A1 | 10/2016 | Matsumoto et al. | |
| 2016/0293418 A1 | 10/2016 | Pasquale et al. | |
| 2016/0293437 A1 | 10/2016 | Zhou et al. | |
| 2016/0293438 A1 | 10/2016 | Zhou et al. | |
| 2016/0314985 A1 | 10/2016 | Yang et al. | |
| 2016/0329207 A1 | 11/2016 | Mohanty et al. | |
| 2016/0336178 A1 | 11/2016 | Swaminathan et al. | |
| 2016/0358782 A1 | 12/2016 | Yang et al. | |
| 2016/0379842 A1 | 12/2016 | Kal et al. | |
| 2017/0102612 A1 | 4/2017 | Meyers et al. | |

(56) References Cited

U.S. PATENT DOCUMENTS

| | | |
|---|---|---|
| 2017/0301552 A1 | 10/2017 | Devilliers |
| 2018/0012759 A1 | 1/2018 | Smith et al. |
| 2018/0240667 A1 | 2/2018 | Yu et al. |
| 2018/0090335 A1 | 3/2018 | Karve et al. |
| 2018/0204731 A1 | 7/2018 | Zhang et al. |
| 2018/0233398 A1 | 8/2018 | van Cleemput et al. |
| 2018/0277661 A1 | 9/2018 | Nagayama et al. |
| 2019/0137870 A1 | 5/2019 | Meyers et al. |
| 2019/0157084 A1 | 5/2019 | Huang et al. |
| 2019/0237341 A1 | 8/2019 | Yu et al. |
| 2019/0312147 A1 | 10/2019 | Lee et al. |
| 2019/0390341 A1 | 12/2019 | Singhal et al. |
| 2020/0006082 A1 | 1/2020 | Su |
| 2020/0051807 A1 | 2/2020 | Singhal et al. |
| 2020/0083044 A1 | 3/2020 | Yu et al. |
| 2020/0133131 A1 | 4/2020 | Ouyang |
| 2020/0199751 A1 | 6/2020 | Singhal et al. |
| 2020/0219725 A1 | 7/2020 | Smith et al. |
| 2020/0219758 A1 | 7/2020 | van Cleemput et al. |
| 2021/0242019 A1 | 8/2021 | Smith et al. |
| 2021/0265163 A1 | 8/2021 | Yu et al. |
| 2021/0265173 A1 | 8/2021 | Yu et al. |
| 2021/0343579 A1 | 11/2021 | Van Cleemput et al. |
| 2022/0005694 A1 | 1/2022 | Smith et al. |
| 2022/0021099 A1 | 1/2022 | Shrivastava et al. |
| 2022/0165571 A1 | 5/2022 | Yu et al. |
| 2022/0208551 A1 | 6/2022 | Heo et al. |
| 2022/0270877 A1 | 8/2022 | Yu et al. |
| 2023/0197459 A1 | 6/2023 | Heo et al. |
| 2023/0227970 A1 | 7/2023 | Ha et al. |
| 2023/0238238 A1 | 7/2023 | Singhal et al. |
| 2024/0030031 A1 | 1/2024 | Smith et al. |

FOREIGN PATENT DOCUMENTS

| | | |
|---|---|---|
| EP | RD301101 A | 5/1989 |
| JP | S5330798 A | 3/1978 |
| JP | S62136579 A | 6/1987 |
| JP | S6425420 A | 1/1989 |
| JP | H01259184 A | 10/1989 |
| JP | H0298007 A | 4/1990 |
| JP | H0377209 A | 4/1991 |
| JP | H03136249 A | 6/1991 |
| JP | H04506888 A | 11/1992 |
| JP | H05267701 A | 10/1993 |
| JP | H06151379 A | 5/1994 |
| JP | H09120967 A | 5/1997 |
| JP | 2644758 B2 | 8/1997 |
| JP | H1010549 A | 1/1998 |
| JP | H1081600 A | 3/1998 |
| JP | H11219941 A | 8/1999 |
| JP | 2001068462 A | 3/2001 |
| JP | 2003068155 A | 3/2003 |
| JP | 2005217240 A | 8/2005 |
| JP | 2007096297 A | 4/2007 |
| JP | 2007-208076 A | 8/2007 |
| JP | 62179774 A | 8/2007 |
| JP | 2013179127 A | 9/2013 |
| JP | 2014086500 A | 5/2014 |
| JP | 2015111668 A | 6/2015 |
| JP | 2015122497 A | 7/2015 |
| JP | 2017022368 A | 1/2017 |
| JP | 2018006742 A | 1/2018 |
| KR | 950012151 A | 5/1995 |
| KR | 19990023468 A | 3/1999 |
| KR | 20030007457 A | 1/2003 |
| KR | 20040016779 A | 2/2004 |
| KR | 20070067119 A | 6/2007 |
| KR | 20070076721 A | 7/2007 |
| KR | 20090022667 A | 3/2009 |
| KR | 20120024616 A | 3/2012 |
| KR | 20120125102 A | 11/2012 |
| KR | 20150053253 A | 5/2015 |
| KR | 20160021809 A | 2/2016 |
| KR | 20160110945 A | 9/2016 |
| KR | 10-2017-0141673 A | 12/2017 |
| KR | 20180002026 A | 1/2018 |
| RU | 2053584 C1 | 1/1996 |
| TW | 134077 | 5/1990 |
| TW | 328624 B | 3/1998 |
| TW | 538137 B | 6/2003 |
| TW | 200531080 A | 9/2005 |
| TW | 200938660 A | 9/2009 |
| TW | 201027593 A | 7/2010 |
| TW | 201410914 A | 3/2014 |
| TW | 201427084 A | 7/2014 |
| TW | 201546314 A | 12/2015 |
| TW | 201626564 A | 7/2016 |
| WO | WO-2010134176 A1 | 11/2010 |
| WO | WO-2014010310 A1 | 1/2014 |
| WO | WO-2019216092 A1 | 11/2019 |
| WO | WO-2019217749 A1 | 11/2019 |

OTHER PUBLICATIONS

U.S. Notice of Allowance, dated Jun. 26, 2017, issued in U.S. Appl. No. 15/195,348.

U.S. Office Action, dated Dec. 26, 2019, issued in U.S. Appl. No. 15/713,377.

U.S. Final Office Action, dated Apr. 16, 2020, issued in U.S. Appl. No. 15/713,377.

U.S. Office Action, dated Sep. 14, 2020, issued in U.S. Appl. No. 15/713,377.

U.S. Office Action, dated Sep. 13, 2019, issued in U.S. Appl. No. 15/893,458.

U.S. Final Office Action, dated Mar. 19, 2020, issued in U.S. Appl. No. 15/893,458.

U.S. Office Action, dated Aug. 3, 2020, issued in U.S. Appl. No. 15/893,458.

U.S. Office Action, dated Apr. 11, 2019, issued in U.S. Appl. No. 15/894,635.

U.S. Notice of Allowance, dated Aug. 21, 2019, issued in U.S. Appl. No. 15/894,635.

U.S. Office Action, dated Jun. 25, 2020, issued in U.S. Appl. No. 16/260,764.

Chinese First Office Action dated Jan. 6, 2020 issued in Application No. CN 201710498301.5.

Chinese Second Office Action dated Jun. 15, 2020 issued in Application No. CN 201710498301.5.

International Search Report and Written Opinion (ISA/KR) dated Jun. 27, 2018 issued in Application No. PCT/US18/18019.

International Preliminary Report on Patentability dated Aug. 29, 2019 issued in Application No. PCT/US2018/018019.

International Search Report and Written Opinion (ISA/KR) dated Jul. 3, 2019 issued in Application No. PCT/US2019/022319.

International Search Report and Written Opinion (ISA/KR) dated May 17, 2019 issued in Application No. PCT/US2019/015559.

International Preliminary Report on Patentability dated Aug. 13, 2020 issued in Application No. PCT/US2019/015559.

Choi, W.-S., (Dec. 25, 2009) "The Fabrication of Tin Oxide Films by Atomic Layer Deposition using Tetrakis(Ethylmethylamino) Tin Precursor," *Transactions on Electrical and Electronic Materials*, 10(6):200-202.

Du, X. et al., (Jul./Aug. 2005) "In situ examination of tin oxide atomic layer deposition using quartz crystal microbalance and Fourier transform infrared techniques," *J. Vac. Sci. Technol. A*, 23(4):581-588.

Elam, J.W., et al., (2008) "Atomic Layer Deposition of Indium Tin Oxide Thin Films Using Nonhalogenated Precursors," *J. Phys. Chem. C*, 112(6):1938-1945.

Elam, J.W., et al., (Mar./Apr. 2008) "Atomic layer deposition of tin oxide films using tetrakis(dimethylamino) tin," *J. Vac. Sci. Technol. A*, 26(2):244-252.

Gordon, et al., (1992) "Low-Temperature Atmospheric Pressure Chemical Vapor Deposition of Polycrystalline Tin Nitride Thin Films" *Chem. Mater.* 1992, 4, pp. 68-71.

Heo, J., et al., (2010) "Low Temperature Atomic Layer Deposition of Tin Oxide," *Chemistry of Materials*, 22(17):4964-4973.

(56) References Cited

OTHER PUBLICATIONS

Heo, J., et al., (2012) "Atomic layer deposition of tin oxide with nitric oxide as an oxidant gas," *J. Mater. Chem.*, 22:4599-4602.
Kwon, K.H., et al., (Mar./Apr. 2010) "Etch mechanism of $In_2O_3$ and $SnO_2$ thin films in HBr-based inductively coupled plasmas," *J. Vac. Sci. Technol. A* 28(2):226-231.
Li, X., et al., (2012) "Tin Oxide with Controlled Morphology and Crystallinity by Atomic Layer Deposition onto Graphene Nanosheets for Enhanced Lithium Storage," *Advanced Function Materials*, 22:1647-1654.
Mohri et al., (Oct. 1990) "Plasma Etching of ITO Thin Films Using a $CH_4/H_2$ Gas Mixture," *Japanese Journal of Applied Physics*, 29(10):L1932-L1935.
Mullings, M.N., et al., (Nov./Dec. 2013) "Tin oxide atomic layer deposition from tetrakis(dimethylamino)tin and water," *J. Vac. Sci. Technol. A*, 31(6):061503-1-061503-8.
Wolf, S. and Tauber, R.N. (1986) "Silicon Processing for the VLSI Era," *Process Technology*, vol. 1, Lattice Press, pp. 545-547.
Wu, B.-R., et al., (2014) "Texture-Etched $SnO_2$ Glasses Applied to Silicon Thin-Film Solar Cells," *Journal of Nanomaterials*, vol. 2014, Article ID 907610, 9 pages.
Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
Chiang C L., et al., "Secondary Electron Emission Characteristics of Oxide Electrodes In Flat Electron Emission Lamp," AIP Advances, 2016, vol. 6, 015317, 9 Pages.
CN Office Action dated Mar. 27, 2023, in Application No. CN201880023914.6 with English translation.
CN Office Action dated Mar. 29, 2023, in Application No. CN201810148464.5 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Fitzgerald C B., et al., "Magnetism in Dilute Magnetic Oxide Thin Films Based on SnO2," The American Physical Society, 2006, vol. 74, 115307, 10 Pages.
International Search Report and Written Opinion dated May 18, 2022, in International Application No. PCT/US2022/014984.
International Preliminary Report and Patentability (ISA/KR) dated Oct. 1, 2020 issued in Application No. PCT/US2019/022319.
International Preliminary Report on Patentability dated Aug. 24, 2023, in PCT Application No. PCT/US2022/014984.
International Preliminary Report on Patentability dated Dec. 29, 2022, in PCT Application No. PCT/US2021/036763.
International Preliminary Report on Patentability dated Feb. 2, 2023, in PCT Application No. PCT/US2021/042626.
International Preliminary Report on Patentability dated Jan. 6, 2022 in PCT Application No. PCT/US2020/038996.
International Search Report and Written Opinion dated Nov. 11, 2021, in PCT Application No. PCT/US2021/042626.
International Search Report and Written Opinion dated Oct. 1, 2021, in PCT Application No. PCT/US2021/036763.
International Search Report and Written Opinion dated Oct. 5, 2020, in application No. PCT/US2020/038996.
Jalife S., et al., "Noble Gas Endohedral Fullerenes," Chemical Science, 2020, vol. 11, pp. 6642-6652.
Japanese First Office Action dated Aug. 3, 2021 issued in Application No. JP 2017-120945.
Japanese Journal of Applied Physics, vol. 27, No. 9, Sep. 1988, T. Minami et al.: "Reactive ion etching of transparent conducting tin oxide films using electron cyclotron resonance hydrogen plasma", pp. L 1753-L 1756 (Year: 1988).
JP Office Action dated Nov. 1, 2022, in Application No. JP2019-543306 with English translation.
JP Office Action dated Feb. 1, 2022, in Application No. JP2018-021500 with English translation.
JP Office Action dated Jan. 24, 2023 in Application No. JP2020-540611 with English translation.
JP Office Action dated Jul. 18, 2023 in Application No. JP2022-93370 with English Translation.
JP Office Action dated Mar. 29, 2022, in Application No. JP2019-543306 with English translation.
JP Office Action dated May 10, 2022, in Application No. JP2017-120945 with English translation.
JP Office Action dated Sep. 5, 2023, in Application No. JP2022-154384 with English translation.
JP06151379A (translation) (Year: 1994).
Komen C V., et al., "Structure-Magnetic Property Relationship Intransition Metal (M=V,Cr, Mn, Fe, Co, Ni) Doped Sno2 Nanoparticles," Journal of Applied Physics, 2008, vol. 103, 5 Pages.
Korean First Office Action dated Aug. 18, 2021 issued in Application No. KR 10-2017-0077686.
Korean First Office Action dated Jul. 30, 2021 issued in Application No. KR 10-2021-7017077.
KR Office Action dated Aug. 30, 2022 in Application No. KR10-2020-7024840 With English translation.
KR Office Action dated Jul. 18, 2022 in Application No. KR10-2021-7017077 With English translation.
KR Office Action dated Jun. 8, 2022, in Application No. KR1020200034960 with English translation.
KR Office action dated Apr. 20, 2022, in Application No. KR10-2019-7026772 with English translation.
KR Office Action dated Aug. 18, 2021, in application No. KR1020200034960.
KR Office Action dated Feb. 17, 2022, in Application No. KR10-2021-7017077 with English translation.
KR Office Action dated Jan. 30, 2023 in Application No. KR10-2019-7026772 with English translation.
KR Office Action dated Mar. 29, 2022, in Application No. KR1020170077686 with English translation.
KR Office Action dated Mar. 29, 2022, in Application No. KR1020200034960 with English translation.
KR Office Action dated Mar. 30, 2023, in Application No. KR10-2020-7024840 With English translation.
KR Office Action dated Mar. 30, 2023, in Application No. KR10-2022-7032676 with English translation.
KR Office Action dated May 14, 2023, in Application No. KR10-2021-7017290 with English translation.
KR Office Action dated Nov. 20, 2022, in Application No. KR10-2018-0014921 with English translation.
KR Office Action dated Nov. 20, 2022, in Application No. KR10-2020-0034961 with English translation.
KR Office Action dated Sep. 18, 2023, in Application No. KR10-2022-7003106 with English translation.
Kvon V., et al., "Secondary Electron Emission Of Tin And Tin-Lithium Under Low Energy Helium Plasma Exposure," Nuclear Materials and Energy, 2017, vol. 13, pp. 21-27.
Lin Y., et al., "A New Examination Of Secondary Electron Yield Data," Surface And Interface Analysis, 2005, vol. 37, pp. 895-900.
Notice of Allowance dated Nov. 16, 2021, in U.S. Appl. No. 16/687,142.
Notice of Allowance dated Oct. 27, 2021, in U.S. Appl. No. 16/825,514.
Ogale S B., et al., "High Temperature Ferromagnetism with Giant Magnetic Moment in Transparent Co-doped SnO2-δ," Physical Review Letters, 2003, 17 Pages.
Pedersen A., et al., "Lithiation of Tin Oxide: A Computational Study," Integrated Systems Laboratory, 2014, 20 Pages.
Saunders M., et al., "Noble Gas Atoms Inside Fullerenes," Science, 1996, vol. 271, pp. 1693-1697.
Singh R ., "Unexpected Magnetism In Nanomaterials," Journal of Magnetism and Magnetic Materials, 2013, vol. 346, pp. 58-73.
Taiwanese First Office Action dated Dec. 2, 2020 issued in Application No. TW 106121182.
Taiwanese First Office Action dated Jun. 17, 2021 issued in Application No. TW 107104861.
Taiwanese Second Office Action dated Jul. 20, 2021 issued in Application No. TW 106121182.

(56) References Cited

OTHER PUBLICATIONS

Tian Y F., et al., "Oxide Magnetic Semiconductors: Materials, Properties, And Devices," Magnetism, Magnetic Materials, And Interdisciplinary Research, 2013, vol. 22(8), 2 Pages.
TW Office Action dated Dec. 30, 2021, in application No. 110121421 with English translation.
TW Office Action dated Nov. 17, 2022, in Application No. TW107104861 with English Translation.
TW Office Action dated Apr. 27, 2022, in Application No. TW107105182 with English translation.
TW Office Action dated Aug. 27, 2021, in Application No. TW110121421 with English translation.
TW Office Action dated Mar. 2, 2023, in Application No. 110121421 with English translation.
TW Office Action dated Mar. 2, 2023, in Application No. TW107105182 with English translation.
TW Office Action dated Mar. 20, 2023, in Application No. TW107105182 with English translation.
TW Office Action dated Oct. 31, 2023, in TW Application No. TW109121292 with English Translation.
TW Office Action dated Sep. 23, 2022 In Application No. TW111123354 with English translation.
TW Office Action dated Sep. 7, 2021, in TW Application No. TW107105182 with English translation.
TW Rejection Decision dated Oct. 21, 2021, in application No. TW107104861 with English translation.
U.S. Corrected Notice of Allowability dated Dec. 1, 2021, in U.S. Appl. No. 16/687,142.
U.S. Corrected Notice of Allowance dated Feb. 16, 2022 in U.S. Appl. No. 16/260,764.
U.S. Corrected Notice of Allowance dated Feb. 22, 2022 in U.S. Appl. No. 16/687,142.
U.S. Corrected Notice of Allowance dated Mar. 17, 2022 in U.S. Appl. No. 16/687,142.
U.S. Corrected Notice of Allowance dated May 6, 2022 in U.S. Appl. No. 16/260,764.
U.S. Corrected Notice of Allowance dated Nov. 25, 2022 in U.S. Appl. No. 17/596,921.
U.S. Final Office Action, dated Dec. 15, 2020, issued in U.S. Appl. No. 15/893,458.
U.S. Final Office Action, dated Dec. 7, 2020 issued in U.S. Appl. No. 16/260,764.
U.S. Final Office Action dated Feb. 17, 2022 in U.S. Appl. No. 16/825,473.
U.S. Final Office Action dated Oct. 23, 2023 in U.S. Appl. No. 17/302,847.
U.S. Non Final Office Action dated Aug. 15, 2022 in U.S. Appl. No. 17/302,044.
U.S. Non-Final Office Action dated Feb. 13, 2023 in U.S. Appl. No. 17/302,847.
U.S. Non-Final Office Action dated May 5, 2023 in U.S. Appl. No. 18/056,468.
U.S. Non-Final Office Action dated Oct. 3, 2023, in U.S. Appl. No. 17/650,550.
U.S. Non-Final Office Action dated Sep. 22, 2023, in U.S. Appl. No. 17/302,850.
U.S. Notice of Allowance dated Apr. 2, 2021 issued in U.S. Appl. No. 15/893,458.
U.S. Notice of Allowance dated Apr. 4, 2022, in U.S. Appl. No. 16/687,142.
U.S. Notice of Allowance dated Aug. 14, 2023, in U.S. Appl. No. 18/056,468.
U.S. Notice of Allowance dated Aug. 23, 2022 in U.S. Appl. No. 17/596,921.
U.S. Notice of Allowance dated Dec. 14, 2022 in U.S. Appl. No. 16/825,473.
U.S. Notice of Allowance dated Feb. 2, 2022 in U.S. Appl. No. 16/260,764.
U.S. Notice of Allowance dated Feb. 27, 2023 in U.S. Appl. No. 16/825,473.
U.S. Notice of Allowance dated Jan. 26, 2021 issued in U.S. Appl. No. 15/713,377.
U.S. Notice of Allowance dated Jun. 5, 2023, in U.S. Appl. No. 17/302,044.
U.S. Notice of Allowance dated Jun. 23, 2021 issued in U.S. Appl. No. 16/825,514.
U.S. Notice of Allowance dated Mar. 16, 2023 in U.S. Appl. No. 16/825,473.
U.S. Notice of Allowance dated May 11, 2022, in U.S. Appl. No. 17/596,921.
U.S. Office Action dated Jun. 24, 2021 issued in U.S. Appl. No. 16/825,473.
U.S. Office Action, dated Mar. 30, 2021, issued in U.S. Appl. No. 16/687,142.
U.S. Office Action dated Oct. 22, 2021 issued in U.S. Appl. No. 16/825,473.
U.S. Office Action, dated Sep. 27, 2021 issued in U.S. Appl. No. 16/260,764.
U.S. Office Action Interview Summary, dated Mar. 11, 2021, issued in U.S. Appl. No. 15/893,458.
U.S. Appl. No. 18/264,391, inventors Kanakasabapathy S K, et al., filed Aug. 4, 2023.
U.S. Appl. No. 18/482,197, inventors Smith, et al., filed Oct. 6, 2023.
U.S. Restriction Requirement dated Apr. 14, 2023 in U.S. Appl. No. 17/302,850.
U.S. Restriction Requirement dated Mar. 17, 2022, in U.S. Appl. No. 17/302,044.
U.S. Restriction requirement dated May 25, 2023, in U.S. Appl. No. 17/650,550.
U.S Restriction requirement dated Sep. 26, 2023 in U.S. Appl. No. 17/304,697.
U.S. Supplemental Notice of Allowance dated Dec. 22, 2022 in U.S. Appl. No. 16/825,473.
KR Office Action dated Nov. 24, 2023 in KR Application No. KR10-2018-0014921.
KR Office Action dated Nov. 24, 2023 in KR Application No. KR10-2020-0034961.
TW Office Action dated Nov. 15, 2023, in TW Application No. TW112117869 with English Translation.
U.S. Appl. No. 18/505,043, inventors Heo S, et al., filed Nov. 8, 2023.
JP Office Action dated Dec. 19, 2023, in JP Application No. 2022-194568 with English translation.
JP Office Action dated Jan. 30, 2024 in JP Application No. 2022-154384, with English Translation.
KR Office Action dated Dec. 21, 2023 in KR Application No. 10-2020-7029725 with English translation.
KR Office Action dated Jan. 17, 2024 in KR Application No. 10-2023-0062221 with English translation.
KR Office Action dated Nov. 24, 2023 in KR Application No. 10-2018-0014921 with English Translation.
KR Office Action dated Nov. 24, 2023 in KR Application No. KR10-2020-0034961 with English Translation.
U.S. Advisory Action dated Jan. 19, 2024 in U.S. Appl. No. 17/302,847.
U.S. Non-Final Office Action dated Dec. 11, 2023 in U.S. Appl. No. 17/448,284.
U.S. Non-Final Office Action dated Feb. 1, 2024 in U.S. Appl. No. 17/302,847.

* cited by examiner

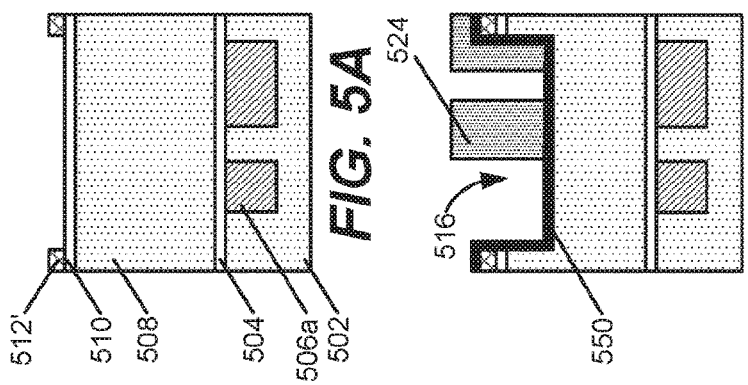

CHAMFER-LESS VIA INTEGRATION SCHEME

CROSS-REFERENCE TO RELATED APPLICATIONS

This application is a National Stage of International Application No. PCT/US2019/022319, filed Mar. 14, 2019, which in turn claims priority to U.S. Provisional Patent Application No. 62/644,783, filed Mar. 19, 2018, each of which is incorporated by reference herein in their entireties and for all purposes.

BACKGROUND

Semiconductor device fabrication involves patterning schemes for forming various structures for integrated circuits. As devices shrink, challenges arise for forming reliable structures.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods and apparatuses for processing semiconductor substrates are provided herein.

Any suitable combination of one or more layers of any of Group IV metal-containing oxide or Group IV metal-containing nitride or sulfide or combinations thereof used as a conformal removable sealant layer may be used in combination with any one or more layers of any of Group IV metal-containing oxide or Group IV metal-containing nitride or sulfide or combinations thereof as a hard mask.

One example includes an integration scheme whereby etching of ultra-low k (ULK) dielectric material is bifurcated by a deposition of a tin oxide conformal removable sealant layer between a trench level and via level of the ULK dielectric material.

One example includes an integration scheme whereby etching of ULK dielectric material is bifurcated by a deposition of a tin nitride conformal removable sealant layer between a trench level and via level of the ULK dielectric material.

One example includes an integration scheme whereby etching of ULK dielectric material is bifurcated by a deposition of a tin nitride conformal removable sealant layer deposited in anaerobic conditions between a trench level and via level of the ULK dielectric material.

One example includes an integration scheme whereby etching of ULK dielectric material is bifurcated by a deposition of a conformal removable sealant layer including tin oxide underlying tin nitride between a trench level and via level of the ULK dielectric material.

One example includes an integration scheme whereby etching of ULK dielectric material is bifurcated by a deposition of a conformal removable sealant layer including tin oxide underlying tin nitride deposited in anaerobic conditions between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a tin oxide conformal removable sealant layer between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a tin nitride conformal removable sealant layer between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a tin nitride conformal removable sealant layer deposited in anaerobic conditions between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a conformal removable sealant layer including tin oxide underlying tin nitride between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a conformal removable sealant layer including tin oxide underlying tin nitride deposited in anaerobic conditions between the trench level and via level of the ULK dielectric material.

One example includes an integration scheme of a substrate having a patterned tin-containing oxide or tin-containing nitride hard mask whereby etching of ULK dielectric material is bifurcated by a deposition of a tin oxide conformal removable sealant layer between a trench level and via level of the ULK dielectric material.

One example includes an integration scheme of a substrate having a patterned tin-containing oxide or tin-containing nitride hard mask whereby etching of ULK dielectric material is bifurcated by a deposition of a tin nitride conformal removable sealant layer between the trench level and via level of the ULK dielectric material.

One example includes an integration scheme of a substrate having a patterned tin-containing oxide or tin-containing nitride hard mask whereby etching of ULK dielectric material is bifurcated by a deposition of a tin nitride conformal removable sealant layer deposited in anaerobic conditions between the trench level and via level of the ULK dielectric material.

One example includes an integration scheme of a substrate having a patterned tin-containing oxide or tin-containing nitride hard mask whereby etching of ULK dielectric material is bifurcated by a deposition of a conformal removable sealant layer including tin oxide underlying tin nitride between the trench level and via level of the ULK dielectric material.

One example includes an integration scheme of a substrate having a patterned tin-containing oxide or tin-containing nitride hard mask whereby etching of ULK dielectric material is bifurcated by a deposition of a conformal removable sealant layer including tin oxide underlying tin nitride deposited in anaerobic conditions between the trench level and via level of the ULK dielectric material.

One example includes an integration scheme of a substrate having a patterned tin oxide hard mask whereby etching of ULK dielectric material is bifurcated by a deposition of a tin oxide conformal removable sealant layer between a trench level and via level of the ULK dielectric material.

One example includes an integration scheme of a substrate having a patterned tin oxide hard mask whereby etching of ULK dielectric material is bifurcated by a deposition of a tin nitride conformal removable sealant layer between the trench level and via level of the ULK dielectric material.

One example includes an integration scheme of a substrate having a patterned tin oxide hard mask whereby etching of ULK dielectric material is bifurcated by a deposition of a tin nitride conformal removable sealant layer deposited in anaerobic conditions between the trench level and via level of the ULK dielectric material.

One example includes an integration scheme of a substrate having a patterned tin oxide hard mask whereby etching of ULK dielectric material is bifurcated by a deposition of a conformal removable sealant layer including tin oxide underlying tin nitride between the trench level and via level of the ULK dielectric material.

One example includes an integration scheme of a substrate having a patterned tin oxide hard mask whereby etching of ULK dielectric material is bifurcated by a deposition of a conformal removable sealant layer including tin oxide underlying tin nitride deposited in anaerobic conditions between the trench level and via level of the ULK dielectric material.

One example includes an integration scheme of a substrate having a patterned tin nitride hard mask whereby etching of ULK dielectric material is bifurcated by a deposition of a tin oxide conformal removable sealant layer between a trench level and via level of the ULK dielectric material.

One example includes an integration scheme of a substrate having a patterned tin nitride hard mask whereby etching of ULK dielectric material is bifurcated by a deposition of a tin nitride conformal removable sealant layer between a trench level and via level of the ULK dielectric material.

One example includes an integration scheme of a substrate having a patterned tin nitride hard mask whereby etching of ULK dielectric material is bifurcated by a deposition of a tin nitride conformal removable sealant layer deposited in anaerobic conditions between the trench level and via level of the ULK dielectric material.

One example includes an integration scheme of a substrate having a patterned tin nitride hard mask whereby etching of ULK dielectric material is bifurcated by a deposition of a conformal removable sealant layer including tin oxide underlying tin nitride between the trench level and via level of the ULK dielectric material.

One example includes an integration scheme of a substrate having a patterned tin nitride hard mask whereby etching of ULK dielectric material is bifurcated by a deposition of a conformal removable sealant layer including tin oxide underlying tin nitride deposited in anaerobic conditions between the trench level and via level of the ULK dielectric material.

One example includes an integration scheme of a substrate having a patterned lead-containing oxide or lead-containing nitride hard mask whereby etching of ULK dielectric material is bifurcated by a deposition of a tin oxide conformal removable sealant layer between a trench level and via level of the ULK dielectric material.

One example includes an integration scheme of a substrate having a patterned lead-containing oxide or lead-containing nitride hard mask whereby etching of ULK dielectric material is bifurcated by a deposition of a tin nitride conformal removable sealant layer between the trench level and via level of the ULK dielectric material.

One example includes an integration scheme of a substrate having a patterned lead-containing oxide or lead-containing nitride hard mask whereby etching of ULK dielectric material is bifurcated by a deposition of a tin nitride conformal removable sealant layer deposited in anaerobic conditions between the trench level and via level of the ULK dielectric material.

One example includes an integration scheme of a substrate having a patterned lead-containing oxide or lead-containing nitride hard mask whereby etching of ULK dielectric material is bifurcated by a deposition of a conformal removable sealant layer including tin oxide underlying tin nitride between the trench level and via level of the ULK dielectric material.

One example includes an integration scheme of a substrate having a patterned lead-containing oxide or lead-containing nitride hard mask whereby etching of ULK dielectric material is bifurcated by a deposition of a conformal removable sealant layer including tin oxide underlying tin nitride deposited in anaerobic conditions between the trench level and via level of the ULK dielectric material.

One example includes an integration scheme of a substrate having a patterned lead oxide hard mask whereby etching of ULK dielectric material is bifurcated by a deposition of a tin oxide conformal removable sealant layer between a trench level and via level of the ULK dielectric material.

One example includes an integration scheme of a substrate having a patterned lead oxide hard mask whereby etching of ULK dielectric material is bifurcated by a deposition of a tin nitride conformal removable sealant layer between the trench level and via level of the ULK dielectric material.

One example includes an integration scheme of a substrate having a patterned lead oxide hard mask whereby etching of ULK dielectric material is bifurcated by a deposition of a tin nitride conformal removable sealant layer deposited in anaerobic conditions between the trench level and via level of the ULK dielectric material.

One example includes an integration scheme of a substrate having a patterned lead oxide hard mask whereby etching of ULK dielectric material is bifurcated by a deposition of a conformal removable sealant layer including tin oxide underlying tin nitride between the trench level and via level of the ULK dielectric material.

One example includes an integration scheme of a substrate having a patterned lead oxide hard mask whereby etching of ULK dielectric material is bifurcated by a deposition of a conformal removable sealant layer including tin oxide underlying tin nitride deposited in anaerobic conditions between the trench level and via level of the ULK dielectric material.

One example includes an integration scheme of a substrate having a patterned lead nitride hard mask whereby etching of ULK dielectric material is bifurcated by a deposition of a tin oxide conformal removable sealant layer between a trench level and via level of the ULK dielectric material.

One example includes an integration scheme of a substrate having a patterned lead nitride hard mask whereby etching of ULK dielectric material is bifurcated by a deposition of a tin nitride conformal removable sealant layer between the trench level and via level of the ULK dielectric material.

One example includes an integration scheme of a substrate having a patterned lead nitride hard mask whereby etching of ULK dielectric material is bifurcated by a deposition of a tin nitride conformal removable sealant layer deposited in anaerobic conditions between the trench level and via level of the ULK dielectric material.

One example includes an integration scheme of a substrate having a patterned lead nitride hard mask whereby etching of ULK dielectric material is bifurcated by a deposition of a conformal removable sealant layer including tin oxide underlying tin nitride between the trench level and via level of the ULK dielectric material.

One example includes an integration scheme of a substrate having a patterned lead nitride hard mask whereby etching of ULK dielectric material is bifurcated by a deposition of a conformal removable sealant layer including tin oxide underlying tin nitride deposited in anaerobic conditions between the trench level and via level of the ULK dielectric material.

One example includes an integration scheme whereby etching of ULK dielectric material is bifurcated by a deposition of a lead oxide conformal removable sealant layer between a trench level and via level of the ULK dielectric material.

One example includes an integration scheme whereby etching of ULK dielectric material is bifurcated by a deposition of a lead nitride conformal removable sealant layer between a trench level and via level of the ULK dielectric material.

One example includes an integration scheme whereby etching of ULK dielectric material is bifurcated by a deposition of a conformal removable sealant layer including lead oxide underlying tin nitride between a trench level and via level of the ULK dielectric material.

One example includes an integration scheme whereby etching of ULK dielectric material is bifurcated by a deposition of a conformal removable sealant layer including tin oxide underlying lead nitride between a trench level and via level of the ULK dielectric material.

One example includes an integration scheme whereby etching of ULK dielectric material is bifurcated by a deposition of a conformal removable sealant layer including lead oxide underlying lead nitride between a trench level and via level of the ULK dielectric material One example includes an integration scheme of a substrate having a patterned Group IV metal-containing oxide or Group IV metal-containing nitride or sulfide hard mask whereby etching of ULK dielectric material is bifurcated by a deposition of a lead oxide conformal removable sealant layer between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a lead nitride conformal removable sealant layer between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a conformal removable sealant layer including lead oxide underlying tin nitride between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a conformal removable sealant layer including tin oxide underlying lead nitride between a trench level and via level of the ULK dielectric material.

One example includes an integration scheme of a substrate having a patterned Group IV metal-containing oxide or Group IV metal-containing nitride or sulfide hard mask whereby etching of ULK dielectric material is bifurcated by a deposition of a conformal removable sealant layer including lead oxide underlying lead nitride between a trench level and via level of the ULK dielectric material.

One example includes an integration scheme of a substrate having a patterned tin-containing oxide or tin-containing nitride hard mask whereby etching of ULK dielectric material is bifurcated by a deposition of a lead oxide conformal removable sealant layer between a trench level and via level of the ULK dielectric material.

One example includes an integration scheme of a substrate having a patterned tin-containing oxide or tin-containing nitride hard mask whereby etching of ULK dielectric material is bifurcated by a deposition of a lead nitride conformal removable sealant layer between a trench level and via level of the ULK dielectric material.

One example includes an integration scheme of a substrate having a patterned tin-containing oxide or tin-containing nitride hard mask whereby etching of ULK dielectric material is bifurcated by a deposition of a conformal removable sealant layer including lead oxide underlying tin nitride between a trench level and via level of the ULK dielectric material.

One example includes an integration scheme of a substrate having a patterned tin-containing oxide or tin-containing nitride hard mask whereby etching of ULK dielectric material is bifurcated by a deposition of a conformal removable sealant layer including tin oxide underlying lead nitride between a trench level and via level of the ULK dielectric material.

One example includes an integration scheme of a substrate having a patterned tin-containing oxide or tin-containing nitride hard mask whereby etching of ULK dielectric material is bifurcated by a deposition of a conformal removable sealant layer including lead oxide underlying lead nitride between a trench level and via level of the ULK dielectric material.

One example includes an integration scheme of a substrate having a patterned tin oxide hard mask whereby etching of ULK dielectric material is bifurcated by a deposition of a lead oxide conformal removable sealant layer between a trench level and via level of the ULK dielectric material.

One example includes an integration scheme of a substrate having a patterned tin oxide hard mask whereby etching of ULK dielectric material is bifurcated by a deposition of a lead nitride conformal removable sealant layer between a trench level and via level of the ULK dielectric material.

One example includes an integration scheme of a substrate having a patterned tin oxide hard mask whereby etching of ULK dielectric material is bifurcated by a deposition of a conformal removable sealant layer including lead oxide underlying tin nitride between a trench level and via level of the ULK dielectric material.

One example includes an integration scheme of a substrate having a patterned tin oxide hard mask whereby etching of ULK dielectric material is bifurcated by a deposition of a conformal removable sealant layer including tin oxide underlying lead nitride between a trench level and via level of the ULK dielectric material.

One example includes an integration scheme of a substrate having a patterned tin oxide hard mask whereby etching of ULK dielectric material is bifurcated by a deposition of a conformal removable sealant layer including lead oxide underlying lead nitride between a trench level and via level of the ULK dielectric material.

One example includes an integration scheme of a substrate having a patterned tin nitride hard mask whereby etching of ULK dielectric material is bifurcated by a deposition of a lead oxide conformal removable sealant layer between a trench level and via level of the ULK dielectric material.

One example includes an integration scheme of a substrate having a patterned tin nitride hard mask whereby etching of ULK dielectric material is bifurcated by a deposition of a lead nitride conformal removable sealant layer between a trench level and via level of the ULK dielectric material.

One example includes an integration scheme of a substrate having a patterned tin nitride hard mask whereby etching of ULK dielectric material is bifurcated by a deposition of a conformal removable sealant layer including lead oxide underlying tin nitride between a trench level and via level of the ULK dielectric material.

One example includes an integration scheme of a substrate having a patterned tin nitride hard mask whereby etching of ULK dielectric material is bifurcated by a deposition of a conformal removable sealant layer including tin oxide underlying lead nitride between a trench level and via level of the ULK dielectric material.

One example includes an integration scheme of a substrate having a patterned tin nitride hard mask whereby etching of ULK dielectric material is bifurcated by a deposition of a conformal removable sealant layer including lead oxide underlying lead nitride between a trench level and via level of the ULK dielectric material.

One example includes an integration scheme of a substrate having a patterned lead-containing oxide or lead-containing nitride hard mask whereby etching of ULK dielectric material is bifurcated by a deposition of a lead oxide conformal removable sealant layer between a trench level and via level of the ULK dielectric material.

One example includes an integration scheme of a substrate having a patterned lead-containing oxide or lead-containing nitride hard mask whereby etching of ULK dielectric material is bifurcated by a deposition of a lead nitride conformal removable sealant layer between a trench level and via level of the ULK dielectric material.

One example includes an integration scheme of a substrate having a patterned lead-containing oxide or lead-containing nitride hard mask whereby etching of ULK dielectric material is bifurcated by a deposition of a conformal removable sealant layer including lead oxide underlying tin nitride between a trench level and via level of the ULK dielectric material.

One example includes an integration scheme of a substrate having a patterned lead-containing oxide or lead-containing nitride hard mask whereby etching of ULK dielectric material is bifurcated by a deposition of a conformal removable sealant layer including tin oxide underlying lead nitride between a trench level and via level of the ULK dielectric material.

One example includes an integration scheme of a substrate having a patterned lead-containing oxide or lead-containing nitride hard mask whereby etching of ULK dielectric material is bifurcated by a deposition of a conformal removable sealant layer including lead oxide underlying lead nitride between a trench level and via level of the ULK dielectric material.

One example includes an integration scheme of a substrate having a patterned lead oxide hard mask whereby etching of ULK dielectric material is bifurcated by a deposition of a lead oxide conformal removable sealant layer between a trench level and via level of the ULK dielectric material.

One example includes an integration scheme of a substrate having a patterned lead oxide hard mask whereby etching of ULK dielectric material is bifurcated by a deposition of a lead nitride conformal removable sealant layer between a trench level and via level of the ULK dielectric material.

One example includes an integration scheme of a substrate having a patterned lead oxide hard mask whereby etching of ULK dielectric material is bifurcated by a deposition of a conformal removable sealant layer including lead oxide underlying tin nitride between a trench level and via level of the ULK dielectric material.

One example includes an integration scheme of a substrate having a patterned lead oxide hard mask whereby etching of ULK dielectric material is bifurcated by a deposition of a conformal removable sealant layer including tin oxide underlying lead nitride between a trench level and via level of the ULK dielectric material.

One example includes an integration scheme of a substrate having a patterned lead oxide hard mask whereby etching of ULK dielectric material is bifurcated by a deposition of a conformal removable sealant layer including lead oxide underlying lead nitride between a trench level and via level of the ULK dielectric material.

One example includes an integration scheme of a substrate having a patterned lead nitride hard mask whereby etching of ULK dielectric material is bifurcated by a deposition of a lead oxide conformal removable sealant layer between a trench level and via level of the ULK dielectric material.

One example includes an integration scheme of a substrate having a patterned lead nitride hard mask whereby etching of ULK dielectric material is bifurcated by a deposition of a lead nitride conformal removable sealant layer between a trench level and via level of the ULK dielectric material.

One example includes an integration scheme of a substrate having a patterned lead nitride hard mask whereby etching of ULK dielectric material is bifurcated by a deposition of a conformal removable sealant layer including lead oxide underlying tin nitride between a trench level and via level of the ULK dielectric material.

One example includes an integration scheme of a substrate having a patterned lead nitride hard mask whereby etching of ULK dielectric material is bifurcated by a deposition of a conformal removable sealant layer including tin oxide underlying lead nitride between a trench level and via level of the ULK dielectric material.

One example includes an integration scheme of a substrate having a patterned lead nitride hard mask whereby etching of ULK dielectric material is bifurcated by a deposition of a conformal removable sealant layer including lead oxide underlying lead nitride between a trench level and via level of the ULK dielectric material.

These and other aspects are described further below with reference to the drawings.

BRIEF DESCRIPTION OF THE DRAWINGS

FIGS. 5A-5G are schematic illustrations of example substrates in various stages of processing performed in accordance with certain disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor device fabrication involves patterning schemes to achieve desired structures. For example, in complementary metal-oxide-semiconductor (CMOS) fabrication for constructing integrated circuits, one technique includes trench first metal hardmask patterning to form self-aligned vias in the 20 nm to 22 nm nodes. Some processes can cause the formation of a chamfer in the via-to-trench bottom junction. This chamfer can impact dimensional scaling on reliability and chain yield. For example, a chamfer formed from etching can reduce the minimum insulator between two adjacent vias, which can cause a device to be more likely to short, thereby resulting in leakage, reliability degradation and causing via chain yield suppression.

Provided herein are methods of processing semiconductor substrates to form substantially chamferless vias, which have zero to minimal chamfer. Embodiments include various integration schemes for depositing removable material over ultra-low-k dielectric material during the formation of via and trench structures such that the material deposited is capable of being removed without damaging the ultra-low-k dielectric material. Examples include formation of a liner layer after partially etching an ultra-low-k dielectric material for forming a trench prior to forming vias.

Figure 1A:
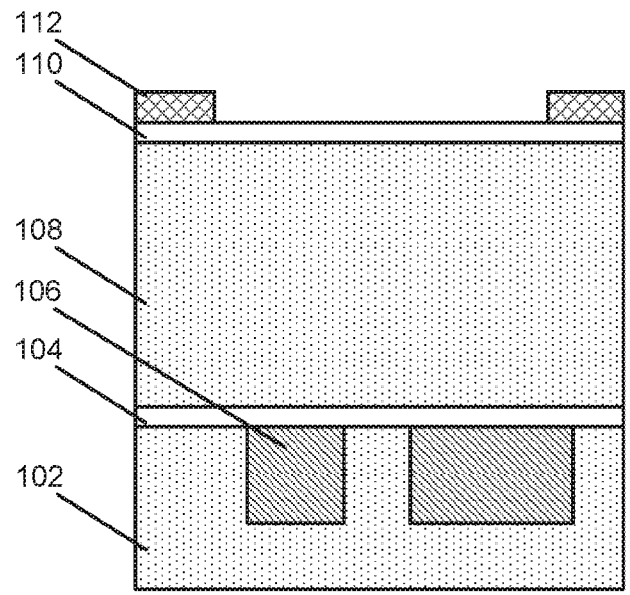
FIG. 1A is a schematic illustration of an example substrate with layers of material.
Figure 1B:
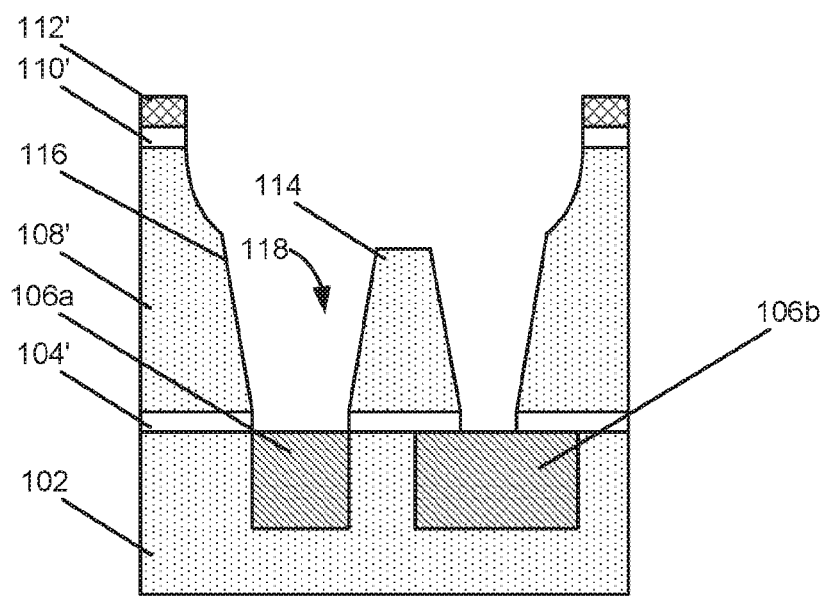
FIG. 1B is a schematic illustration of an example substrate with layers of material following via etch.

For example, one integration scheme may begin with a stack having an ultra-low k ("ULK") dielectric material having what will be a trench level and an underlying via level, a liner layer (such as a layer deposited by tetraethyl orthosilicate ("TEOS")) on top of and adjacent to the ULK to protect the ULK from ambient, and a metal hard mask (such as titanium nitride) on top of the liner layer. ULK dielectric material is defined as dielectric material have a k-value of less than 2.5. The metal hard mask may be etched to form a pattern. An example stack is provided in cross-sectional side view FIG. 1A, showing a dielectric material 102 with metal lines 106, a first liner layer 104, ULK layer 108, second liner layer 110 (such as TEOS), and a patterned metal hard mask 112. Subsequently, spin-on carbon may be formed over the substrate, then patterned to form the mask for forming a via. A via is partially etched into the ULK using the spin-on carbon mask to form a partial via, and the spin-on carbon mask is removed after the via is partially etched. Following removal of the spin-on carbon mask, the trench is then etched. An example cross-sectional side view of substrate after the trench is etched is provided in FIG. 1B, which shows the etched hard mask 112', etched liner layer 110', etched ULK 108', and opened liner layer 104'. Etching operations may cause the via-trench interface to erode and/or sag, as shown at the corner 114, resulting in slanted sidewalls 116. Following etching of the via and trench, metallization is performed, filling the via and trench. As devices shrink and metal lines are formed closer and closer together, a chamfer formed at corner 114 can cause reliability issues, as the distance between the metal line 106b and metal in the via 118 may be smaller than the distance between metal lines 106b and 106a in the same level. The device tolerance may assume the latter distance is the minimum distance, causing reliability problems when it is not.

Provided herein are methods for forming vias having vertical sidewalls. In some embodiments, the methods involve forming a sacrificial layer during a bifurcated approach for forming vias and trenches in a patterning scheme. In various embodiments, after a sacrificial layer is deposited over a ULK dielectric material, a patterned mask may be formed on the sacrificial layer. The patterned mask is then used to etch the ULK dielectric material. The sacrificial layer can then act as a protective sealant to prevent damage to underlying ULK dielectric material during etching of the ULK dielectric material. For example, if the patterned mask is formed directly on the ULK dielectric material and a sacrificial layer is not used, the etching process of the ULK dielectric material may erode corners of the ULK dielectric material, resulting in chamfers. The sacrificial layer protects corners of the ULK dielectric material to maintain the profile of the pattern. In some embodiments, the sacrificial layer acts as a protective sealant to prevent percolating of mask material to the underlying ULK dielectric material. In some embodiments, the sacrificial layer has properties to allow its removal during removal of the mask material. In some embodiments, a single removal operation may be performed to remove both the mask material and the sacrificial layer. Disclosed embodiments also include use of sacrificial layer material as a hard mask prior to etching a first amount of ULK dielectric material. This may facilitate maintaining aspect ratios of the etched features in the integration scheme. In some embodiments, the hard mask and sacrificial layer are the same material, allowing etch of both in an operation after etching the ULK dielectric material.

In some embodiments, the sacrificial layer and the mask can be removed using a single chemistry, which can be performed in a single operation. In some embodiments, the sacrificial layer and the mask can be removed using two different chemistries, performed in two separate operations. In some embodiments, since the sacrificial layer can protect the ULK dielectric material, the substrate can be exposed to a harsher chemistry that could damage the ULK dielectric to remove the mask material, followed by a milder etching operation that selectively etches the sacrificial layer relative to the ULK dielectric layer without damaging the ULK dielectric layer. In some embodiments, methods also include forming vias by using a metal hardmask having the same removability properties as the sacrificial layer to reduce the number of processing steps. Example sacrificial layer materials include metal oxides having a metal from Group IV of the Periodic Table of Elements and metal nitrides having a metal from Group IV of the Periodic Table of Elements. For example, the sacrificial layer material can be a tin oxide (such as tin oxide or tin(II) oxide (SnO), and stannic oxide or tin(IV) oxide ($SnO_2$)), a tin nitride (such as tin nitride or tin(II) nitride ($Sn_3N_2$), and stannic nitride or tin(IV) nitride ($Sn_3N_4$)), a lead oxide (such as lead(II) oxide (PbO) and lead(IV) oxide ($Pb_2O$)), or a lead nitride (such as lead(II) nitride ($Pb_3N_2$) and lead(IV) nitride ($Pb_2N$)). Additionally, in some embodiments, the sacrificial layer may include two or more layers, each of which may have a different composition or the same composition.

Figure 2:
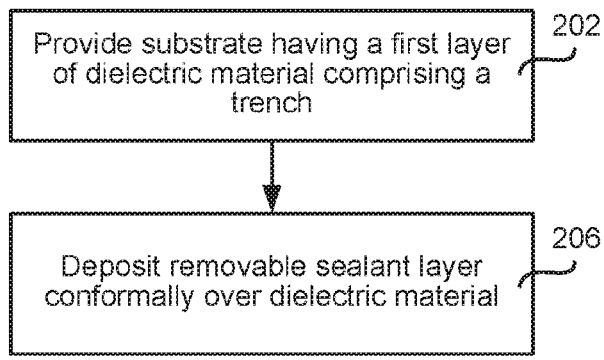
FIGS. 2, 3, and 4 are process flow diagrams of operations performed in accordance with certain disclosed embodiments.

FIG. 2 provides a process flow diagram for operations performed in accordance with certain disclosed embodiments. In operation 202, a substrate having a first layer of dielectric material and a trench is provided. In some embodiments, the substrate is provided to a process chamber. The process chamber includes a pedestal or substrate holder where the substrate is placed. The substrate may be a silicon wafer, e.g., a 200-mm wafer, a 300-mm wafer, or a 450-mm wafer, including wafers having one or more layers of material, such as dielectric, conducting, or semi-conducting material deposited thereon. The substrate may have multiple layers, such as a barrier layer or adhesion layer. Non-limiting examples of layers include dielectric layers and conducting layers, e.g., silicon oxides, silicon nitrides, silicon carbides, metal oxides, metal nitrides, metal carbides, and metal layers.

The substrate includes a first layer of dielectric material and a trench. In various embodiments, the first layer of dielectric material may be formed by gapfill deposition processes, chemical vapor deposition ("CVD"), plasma enhanced CVD ("PECVD"), atomic layer deposition ("ALD"), plasma enhanced ALD ("PEALD") or any other suitable deposition technique. The first layer of dielectric material has a thickness between 50 nm and 100 nm. The patterned hard mask has a thickness between 10 nm and 50 nm. The patterned hard mask may be defined by lithographic techniques. In some embodiments, the patterned hard mask is formed by depositing via physical vapor deposition ("PVD").

A trench may be characterized by one or more of narrow and/or re-entrant openings, constrictions within the feature. The trench is formed in the first layer of dielectric material but may not penetrate the full thickness of the first layer of dielectric material. The trench may be formed in the first layer of dielectric material such that the depth of the trench as measured from the trench opening to the bottom of the trench is at least about 25% of the thickness of the first layer. The trench may be formed by etching between about 50% and about 75% of the thickness of the first layer of dielectric material. The trench may have an aspect ratio of at least about 1:1, at least about 2:1, at least about 4:1, at least about 6:1, at least about 10:1, or higher. The trench has a dimension near the opening, e.g., an opening diameter or line width of between about 10 nm to 500 nm, for example between about 25 nm and about 300 nm. The trench may also be referred to as a feature. The terms "trench" and "feature" may be used interchangeably in the present disclosure and will be understood to include any hole, via, or recessed region of a substrate.

In operation 206, a removable sealant layer is deposited conformally over the dielectric material. The removable sealant layer may be conformal to the trench topography. The removable sealant layer may be deposited using techniques to minimize damage to the underlying dielectric, and may be deposited to be within about 5% of the trench critical dimension. In some embodiments, the removable sealant layer prevents ingress of lithographic materials used in patterning of via levels into the trench dielectric. In various embodiments, the removable sealant layer provides sufficient etch selectivity, such as etch selectivity greater than about 10:1 relative to the other material on the surface in favor of lithographic material above it during patterning to allow overetching of lithographic material while landing on the removable sealant layer. In various embodiments, the removable sealant layer is removable using a reducing chemistry, which may be any one or more of the following: a mixture of nitrogen and hydrogen gas, a mixture of helium and hydrogen gas, methane gas, ethylene gas, or organic acids.

The removable sealant layer may be ashable in some embodiments. Ashable is defined as being removable isotropically by a dry plasma. In various embodiments, the removable sealant layer is deposited directly on the exposed trench surface, which may be ULK dielectric material. The removable sealant layer may be deposited conformally. Conformality of films may be measured by the step coverage. Step coverage may be calculated by comparing the average thickness of a deposited film on a bottom, sidewall, or top of a trench to the average thickness of a deposited film on a bottom, sidewall, or top of a trench.

One example of step coverage may be calculated by dividing the average thickness of the deposited film on the sidewall by the average thickness of the deposited film at the top of the feature and multiplying it by 100 to obtain a percentage. The step coverage of the removable sealant layer deposited over the first layer of dielectric material in certain disclosed embodiments may be between about 90% and about 100%, or at least about 90%, or between about 95% and about 100%.

The removable sealant layer has various properties. One property is that it can act as a barrier layer, thereby "freezing" the profile of the structure underlying it, preventing the underlying structure from damage. In various embodiments, the removable sealant layer is a hyphenation film, which is defined as a film that acts as a barrier to prevent lithographic materials and reagent used in applying, patterning, and removing said materials from ingress into the trench dielectric which protects the trench dielectric. Where the removable sealant layer is deposited directly on and therefore adjacent to ULK dielectric material prior to formation of another mask layer material, such as spin-on carbon, over the ULK dielectric material, the removable sealant layer prevents chemistry from the mask material such as spin-on carbon from percolating into the underlying ULK film and can be, in essence, a "sealant," defined as having properties preventing or eliminating diffusion from material disposed on one side of the layer to the other. Another property is that it is a removable film. The removable sealant layer has properties such that it can be removed using chemistries that do not damage the underlying ULK material. It also allows for the use of different etch chemistries for removing overlying mask material, thereby preventing the underlying ULK from damage during removal of, for example, spin-on carbon mask material, as removal of the removable sealant layer may be performed using separate chemistry following removal of the spin-on carbon. In some embodiments, the removable sealant layer is considered a sacrificial film.

The removable sealant layer is a Group IV-containing oxide or nitride film. For example, in some embodiments, the removable sealant layer is a tin-containing oxide film. In some embodiments, the removable sealant layer is a tin-containing nitride film. In some embodiments, the removable sealant layer is a lead-containing oxide film. In some embodiments, the removable sealant layer is a lead-containing nitride film. For example, the removable sealant layer may be tin oxide or tin(II) oxide (SnO), stannic oxide or tin(IV) oxide ($SnO_2$), tin nitride or tin(II) nitride ($Sn_3N_2$), stannic nitride or tin(IV) nitride ($Sn_3N_4$), lead(II) oxide (PbO), lead(IV) oxide ($Pb_2O$), lead(II) nitride ($Pb_3N_2$), or lead(IV) nitride ($Pb_2N$). It will be understood that in some embodiments, the film is not necessarily a stoichiometric film. For example, in some cases, the film is sub-stoichiometric. For example, a tin-containing oxide film may be tin oxide or stannic oxide, which may include a tin to oxygen atomic ratio between about 0.45 to about 1.05. In some embodiments, the removable film is tin(II) oxide having the chemical structure of SnO. In some embodiments, the removable film is tin(IV) oxide having the chemical structure of $SnO_2$.

In various embodiments, a tin nitride removable sealant layer is deposited in anaerobic conditions. Anaerobic is defined as being oxygen-free. In various embodiments, a tin nitride or tin sulfide removable sealant layer is deposited in an oxygen-free environment. In various embodiments, a tin nitride removable sealant layer is deposited in an oxygen-free environment. For example, in some embodiments, tin nitride is deposited by PECVD.

In some embodiments, where the removable sealant layer is being deposited on a layer sensitive to ambient, such as a ULK dielectric layer, the removable sealant layer may include a Group IV metal-containing oxide underlayer with a Group IV metal-containing oxide or Group IV metal-containing nitride or Group IV metal-containing sulfide deposited over the Group IV metal-containing oxide underlayer.

The removable sealant layer may be deposited by CVD, PECVD, ALD, PEALD, or any other suitable deposition technique. The removable sealant layer may be deposited to a thickness between about 2.5 nm and about 5 nm. In various embodiments, the removable sealant layer layer has a thickness of about 5 nm. In some embodiments, the removable sealant layer is deposited to a thickness less than about 5 nm. The removable sealant layer may be deposited at a substrate temperature between about 50° C. and about 400° C. In some embodiments, the substrate is processed in a process chamber.

In some embodiments, the removable sealant layer is a tin oxide film, such as tin oxide. A tin oxide removable sealant layer is deposited by any suitable method such as by CVD (including PECVD), ALD (including PEALD), sputtering, etc. In some embodiments the tin removable sealant oxide layer is deposited conformally to a thickness of between about 5 and about 30 nm, such as between about 10 and about 20 nm. One of the suitable deposition methods of conformal tin oxide film is ALD. Thermal ALD or PEALD can be used. In a thermal ALD method, the substrate is provided to an ALD process chamber and is sequentially exposed to a tin-containing precursor, and an oxygen-containing reactant, where the tin-containing precursor and the oxygen containing reactant are allowed to react on the surface of the substrate to form tin oxide. The ALD process chamber may be purged with an inert gas after the substrate is exposed to the tin-containing precursor, and before the oxygen-containing reactant is admitted to the process chamber to prevent reaction in the bulk of the process chamber. Further, the ALD process chamber may be purged with an inert gas after the substrate has been treated with the oxygen-containing reactant. The sequential exposure is repeated for several cycles, each cycle having a tin-containing precursor exposure and oxidizing agent exposure, e.g., between about 10-100 cycles can be performed until the tin oxide layer having desired thickness is deposited. Examples of suitable tin-containing precursors include halogenated tin-containing precursors (such as tin(II) chloride ($SnCl_4$), and tin(II) bromide ($SnBr_4$)), and non-halogenated tin-containing precursors, such as organotin compounds, which include alkyl-substituted tin amides and the like. Specific examples of alkyl-substituted tin amides that are suitable for ALD include tetrakis(dimethylamino) tin, tetrakis(ethylmethylamino) tin, $N^2,N^3$-di-tert-butyl-butane-2,3-diamino-tin (II) and (1,3-bis(1,1-dimethylethyl)-4,5-dimethyl-(4R,5R)-1,3,2-diazastannolidin-2-ylidine. Oxygen-containing reactants include but are not limited to oxygen ($O_2$), ozone ($O_3$), water ($H_2O$), hydrogen peroxide ($H_2O_2$), and nitric oxide (NO). Mixtures of oxygen-containing reactants can also be used. The deposition conditions will vary depending on the choice of ALD reactants, where more reactive precursors will generally react at lower temperatures than less reactive precursors. The processes may be carried out at a temperature of between about 20° C. and about 500° C., and at a sub-atmospheric pressure. The temperature and pressure may be selected such that the reactants remain in the gaseous form in the process chamber to avoid condensation. Each reactant is provided to the process chamber in a gaseous form either alone or mixed with a carrier gas, such as argon, helium, or nitrogen ($N_2$). The flow rates of these mixtures will depend on the size of the process chamber, and are in some embodiments between about 10 sccm and about 10,000 sccm.

A specific example of thermal ALD process conditions that are suitable for depositing a conformal tin oxide removable sealant layer provided herein is described in an article by Li et al. titled "Tin Oxide with Controlled Morphology and Crystallinity by Atomic Layer Deposition onto Graphene Nanosheets for Enhanced Lithium Storage" (*Advanced Functional Materials*, 2012, 22, 8, 1647-1654) which is herein incorporated by reference in its entirety. The process includes sequentially and alternately exposing the substrate in an ALD vacuum chamber to $SnCl_4$ (the tin-containing precursor) and deionized water (the oxygen-containing reactant) at a temperature of 200° C.-400° C. In a specific example of an ALD cycle, a mixture of $SnCl_4$ vapor with $N_2$ carrier gas is introduced into the ALD process chamber for 0.5 seconds, and is then exposed to the substrate for 3 seconds. Next the ALD process chamber is purged with $N_2$ for 10 seconds to remove $SnCl_4$ from the bulk of the process chamber, and a mixture of $H_2O$ vapor with $N_2$ carrier gas is flowed into the process chamber for 1 second and is exposed to the substrate for 3 seconds. Next, the ALD process chamber is purged with $N_2$ and the cycle is repeated. The ALD process is performed at subatmospheric pressure (e.g., 0.4 Torr) and at a temperature of 200° C.-400° C.

Another example of thermal ALD process conditions that are suitable for depositing a tin oxide removable sealant layer in the certain methods provided herein, is given in an article by Du et al. titled "In situ Examination of Tin Oxide Atomic Layer Deposition using Quartz Crystal Microbalance and Fourier Transform Infrared Techniques" (*J. Vac. Sci. Technol. A* 23, 581 (2005)), which is herein incorporated by reference in its entirety. In this process the substrate is sequentially exposed to $SnCl_4$ and $H_2O_2$ in an ALD process chamber at a temperature of between about 150° C. and about 430° C.

While the use of halogenated tin precursors in ALD is suitable in many embodiments, in some embodiments a non-halogenated organotin precursor may be used to avoid corrosion problems that may occur with the use of halogenated precursors such as $SnCl_4$. Examples of suitable non-halogenated organotin precursors include alkylaminotin (alkylated tin amide) precursors, such as tetrakis (dimethylamino) tin. An example of a suitable thermal ALD deposition method that uses this precursor is provided in an article by Elam et al., titled "Atomic Layer Deposition of Tin Oxide Films using Tetrakis(dimethylamino) tin" (*J. Vac. Sci. Technol. A* 26, 244 (2008)), which is herein incorporated by reference in its entirety. In this method the substrate is sequentially exposed in an ALD chamber to tetrakis(dimethylamino) tin and $H_2O_2$ at a temperature of between about 50° C. and about 300° C. The use of this precursor allows deposition of tin oxide films at low temperatures of 100° C. or less. For example, tin oxide films can be deposited at 50° C. without the use of plasma to enhance reaction rate. Another example of thermal ALD of tin oxide using tetrakis (dimethylamino) tin and $H_2O_2$ is provided in an article by Elam et al. titled "Atomic Layer Deposition of Indium Tin Oxide Thin Films Using Nonhalogenated Precursors" (*J. Phys. Chem. C* 2008, 112, 1938-1945), which is herein incorporated by reference.

Another example of low temperature thermal ALD process with the use of a reactive organotin precursor is provided in an article by Heo et al., titled "Low temperature Atomic Layer Deposition of Tin Oxide" (*Chem. Mater.*, 2010, 42(7) 4964-4973), which is herein incorporated by reference in its entirety. In this deposition process (which may be suitable for depositing tin oxide films provided herein), the substrate is sequentially exposed in an ALD vacuum process chamber to $N^2$, $N^3$-di-tert-butyl-butane-2,3-diamino-tin(II) and 50% $H_2O_2$. These reactants are vaporized and each is provided to the process chamber mixed with an $N_2$ carrier gas. The chamber is purged with $N_2$ after each exposure of the substrate to a reactant. The deposition can be carried out at a temperature of between about 50° C. and about 150° C.

While $H_2O_2$ generally works well as an oxygen-containing reactant for formation of tin oxide in ALD processes, it may sometimes provide insufficient control over tin oxide film growth due to $H_2O_2$ decomposition. In some embodiments, a more stable oxygen-containing precursor, such as NO, is used. An example of suitable process conditions with the use of NO as an oxygen-containing reactant is provided in an article by Heo et al., titled "Atomic Layer Deposition of Tin Oxide with Nitric Oxide as an Oxidant Gas" (*J. Mater. Chem.*, 2012, 22, 4599), which is herein incorporated by reference. The deposition involves exposing the substrate sequentially to a cyclic Sn(II) amide (1,3-bis(1,1-dimethylethyl)-4,5-dimethyl-(4R,5R)-1,3,2-diazastannolidin-2-ylidine and to NO at a temperature of about 130-250° C.

In some embodiments, tin oxide films are deposited by PEALD. The same types of tin-containing precursors and oxygen-containing reactants as described above for thermal ALD can be used. In PEALD, the ALD apparatus is equipped with a system for generating plasma in the process chamber, and for treating the substrate with the plasma. In a PEALD process sequence, the substrate is provided to the PEALD process chamber and is exposed to the tin-containing precursor which adsorbs on the surface of the substrate. The process chamber is purged with an inert gas (e.g., argon or helium) to remove precursor molecules that did not adsorb to the substrate surface from the process chamber, and the substrate is exposed to an oxygen-containing reactant which is introduced into the process chamber. Concurrently with the introduction of the oxygen-containing reactant or after a delay, plasma is formed in the process chamber. The plasma facilitates the reaction between the oxygen-containing reactant and the tin-containing precursor on the surface of the substrate that results in formation of tin oxide. The process chamber is purged with an inert gas, and, in some embodiments, a cycle including exposure to the tin-containing precursor, purge, exposure to the oxygen-containing reactant, generation of the plasma, and a second purge is repeated as many times as desired to form a tin oxide film of desired thickness in a layer-by-layer manner. In some embodiments, a cycle forms a monolayer or less than a monolayer of tin oxide on the surface of the substrate.

An example of process conditions that are suitable for PEALD formation of tin oxide film is provided in an article by Seop et al., titled "The Fabrication of Tin Oxide Films by Atomic Layer Deposition using Tetrakis(ethylmethylamino) tin Precursor" (*Transactions on Electrical and Electronic Materials*, 2009, 10, 5, 173-176), which is herein incorporated by reference. The substrate is provided into a PEALD process chamber and is exposed to tetrakis(ethylmethylamino) tin in an absence of plasma with an exposure of 4 seconds. Next, the tin-containing precursor is purged from the process chamber by flowing argon through the process chamber for 20 seconds. Then, $O_2$ is injected for 2 seconds with additional 2 seconds with radio frequency (RF) power of 100 W. This is followed by an argon purge, which completes one PEALD cycle. In this example, the process is conducted at a temperature range of 50-200° C. and at a pressure of 0.8 Torr.

While ALD (both thermal and plasma enhanced) is one method for depositing tin oxide films, it is understood that other tin oxide deposition methods, such as CVD, PECVD, and sputtering can also be used.

Figure 3:
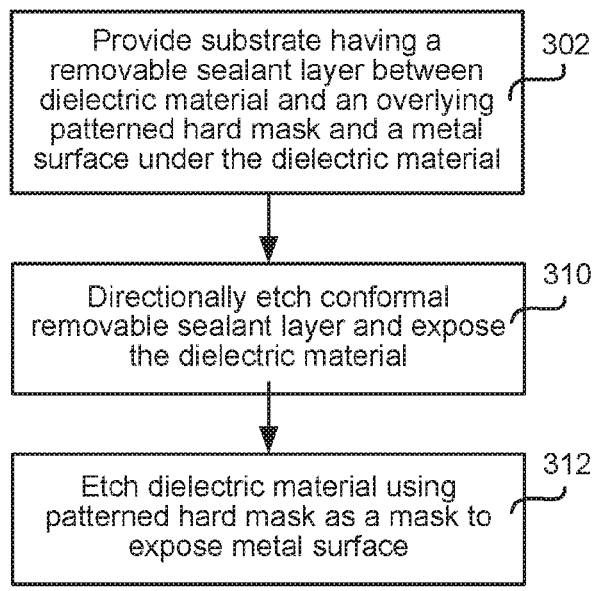

FIG. 3 shows a process flow diagram for operations performed in accordance with certain disclosed embodiments. In operation 302, a substrate having a removable sealant layer between dielectric material and a patterned hard mask over the removable sealant layer is provided. The dielectric material also includes a metal. An example is provided in FIG. 5D, which is described in further detail with respect to FIG. 4 and FIG. 5D in the below examples. In some embodiments, the substrate was previously processed; for example, in some embodiments, operation 206 of FIG. 2 may be performed to form the substrate provided in operation 302.

In operation 310, the conformal removable sealant layer is directionally etched and the dielectric material is exposed. Removal may be used by exposing to a hydrogen-containing gas, which may be one or more of hydrogen ($H_2$), methane ($CH_4$), ethylene ($C_2H_4$), ammonia ($NH_3$), or mixtures thereof. In some embodiments, directionally etching can be performed by exposing the conformal removable sealant layer to one or more of the following dry etching conditions: (1) chlorine ($Cl_2$) and boron trichloride ($BCl_3$); (2) hydrogen bromide (HBr); (3) methane ($CH_4$); (4) ammonia ($NH_3$); (5) hydrogen ($H_2$) diluted in argon, helium, or nitrogen; (6) or combinations thereof delivered separately or together. In some embodiments, this operation involves directional etching using an etch chemistry suitable for removing the conformal removable sealant layer. Directional etching may be accomplished by applying a bias during etching. In some embodiments, the bias is applied to a pedestal holding the substrate being processed. In various embodiments, conformal removable sealant layer is etched in an anaerobic environment.

In operation 312, the dielectric material is etched using the patterned hard mask as a mask to expose the surface of the metal. In various embodiments, etching the dielectric material involves exposing the substrate to oxygen-containing chemistry, such as oxygen gas, oxygen plasma, or the like.

Figure 4:
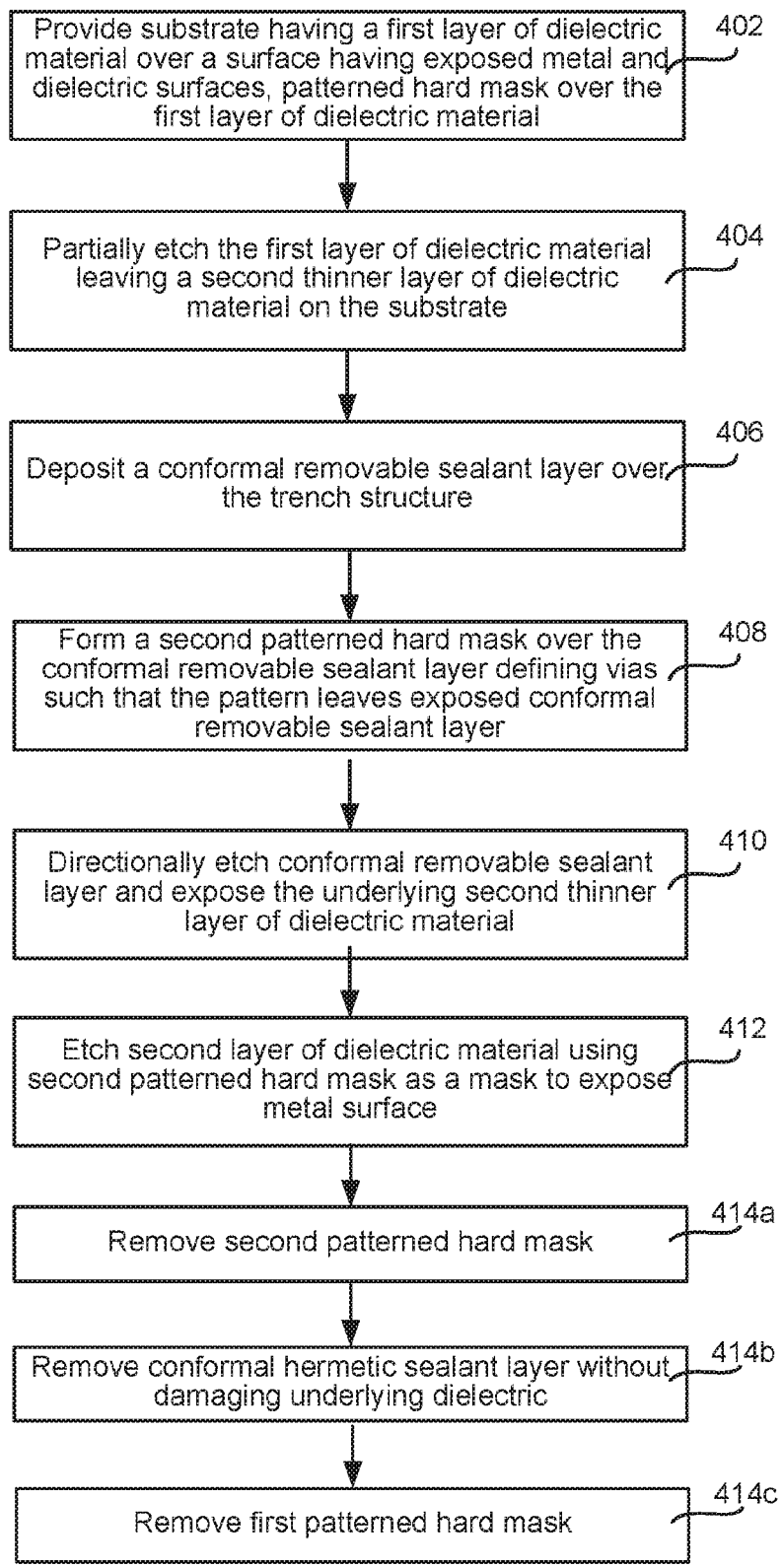

FIG. 4 shows an example of a process flow diagram for one example of operations that may be performed in accordance with certain disclosed embodiments. In operation 402, a substrate is provided, the substrate having a first layer of dielectric material over a surface having exposed metal and dielectric surfaces, and patterned hard mask over the first layer of dielectric material.

One example of a substrate that may be provided in operation 402 of FIG. 4 is depicted in FIG. 5A. FIG. 5A shows a substrate layer 502 with metal lines 506a and a liner or barrier 504, which may be, for example, a TEOS-deposited liner layer. In some embodiments, the liner layer 504 may be a diffusion barrier layer. In some embodiments, the liner layer 504 is not present. Overlying the liner layer 504 is a first layer of dielectric material 508, with a liner layer 510', and patterned hard mask 512'. In some embodiments, the liner layer 510' may be a diffusion barrier layer. In some embodiments, the liner layer 510' is not present.

In various embodiments, substrate layer 502 is a silicon oxide material. In various embodiments, substrate 502 is a ULK dielectric material such as ULK silicon oxide. In some embodiments, substrate layer 502 and the first dielectric layer 508 have the same composition. In some embodiments, substrate layer 502 and the first dielectric layer 508 have different compositions. In some embodiments, the first dielectric layer 508 is an ULK dielectric material. Metal lines 506a may be any suitable metal. Examples include, but are not limited to, copper, tungsten, and cobalt. While the example depicted in FIG. 5A shows different widths of the metal lines 506a, the thickness of the lines and the distance between the metal lines may be any suitable amount, depending on the structure to be fabricated by the integration scheme. Hard mask 512' may be a metal hard mask in some embodiments. In some embodiments, hard mask 512' is a metal-containing hard mask. One example hard mask material is titanium oxide. In some embodiments, hard mask 512' is a tin-containing hard mask or a lead-containing hard mask, embodiments of which are described in detail below with respect to the examples provided in FIG. 6A-6G. For purposes of illustration and example only, FIGS. 5A-5G depict an example whereby the hard mask 512' has a material different from that of the removable sealant 550, which will be described in further detail below. For example, hard mask 512' in FIG. 5A-5G may be titanium oxide.

Returning to FIG. 4, in operation 404, the first layer of dielectric material is partially etched to leave a second, thinner layer of dielectric material on the substrate. During operation 404, the patterned hard mask acts as a mask such that the trench structure is etched. Only a partial thickness of the dielectric material is etched, thereby bifurcating the etching process into two separate operations, operation 404 being the first operation to define a trench level. The second thinner layer of dielectric material is thinner as compared to the first layer of dielectric material prior to partially etching the first layer of dielectric material. In various embodiments, at least 50% of the thickness of the first layer of dielectric material, or between about 50% and about 75% of the thickness of the first layer of dielectric material is etched during operation 404. In various embodiments, the thickness of the second thinner dielectric material is at least about 25% of the first layer of dielectric material. In various embodiments, operation 404 is performed to form a trench having a horizontal bottom surface.

An example is provided in FIG. 5B. FIG. 5B shows a substrate whereby the first layer of dielectric 508 is etched to leave a second thinner dielectric layer 508', thereby forming a trench 518 on the substrate.

Returning to FIG. 4, in operation 406, a conformal removable sealant layer is deposited over the trench structure. FIG. 5C provides an example of a conformal removable sealant layer 550 deposited over the substrate.

Returning to FIG. 4, in operation 408, a second patterned hard mask may be formed over the conformal removable sealant layer to define vias such that the pattern leaves exposed regions of conformal removable sealant layer. For example, in some embodiments, the second patterned hard mask is formed by depositing a hard mask material such as spin-on carbon, and patterning using lithographic techniques. Deposition may be performed by spin-on techniques in some embodiments. Patterning to form the mask to generate vias may be performed by exposing the substrate to a dry etch chemistry including a fluorocarbon gas.

An example is provided FIG. 5D, which shows a second patterned hard mask 524 patterned over conformal removable sealant layer 550, leaving exposed surfaces in vias 516.

Returning to FIG. 4, in operation 410, the conformal removable sealant layer is etched using the second patterned hard mask as a mask to expose the underlying second thinner layer of dielectric material under the conformal removable sealant layer. In some embodiments, this operation involves directional etching using an etch chemistry suitable for removing the conformal removable sealant layer. Directional etching may be accomplished by applying a bias during etching. In some embodiments, the bias is applied to a pedestal holding the substrate being processed. In various embodiments, conformal removable sealant layer is etched in an anaerobic environment. Operation 410 may be performed using process conditions and etching chemistries such as any of those described above with respect to operation 310.

An example is provided in FIG. 5E, which shows the exposed metal surface at the bottom of via 526, leaving conformal removable sealant layer 550' on vertical surfaces and underlying the second patterned hard mask 524.

Returning to FIG. 4, in operation 412, the second thinner layer of dielectric material is etched using the second patterned hard mask as a mask to expose an underlying metal surface underlying the second thinner layer of dielectric material. In various embodiments, etching the second thinner layer of dielectric material involves exposing the substrate to oxygen-containing chemistry, such as oxygen gas, oxygen plasma, or the like.

An example is provided in FIG. 5F, whereby via 536 is formed after etching second dielectric layer 508" to expose the surfaces of metal lines 506a. Following etching the second dielectric layer 508" whereby the liner layer 504 acts as an etch stop layer, the liner layer 504 is etched to form etched liner layer 504' thereby exposing the surfaces of metal lines 506a.

Returning to FIG. 4, in operation 414a, the second patterned hard mask is removed. In operation 414b, the conformal removable sealant layer is removed. In various embodiments, conformal removable sealant layer is etched in an anaerobic environment. If the conformal removable sealant layer includes more than one layer where the layers include more than one type of metal-containing film, such as tin oxide over lead oxide, or tin nitride over lead oxide, or tin oxide over lead nitride, or tin nitride over lead nitride, or lead oxide over tin oxide, or lead oxide over tin nitride, or lead nitride over tin oxide, or lead nitride over tin nitride, the conformal removable sealant layer may be removed using two or more etching chemistries. For example, if the upper layer is a tin nitride or tin oxide, the upper layer may be removed using a hydrogen-containing chemistry, whereas if the upper layer is a lead oxide or lead nitride, the upper layer may be removed using a weak organic acid.

In some embodiments, operations 414a and 414b are combined into one single operation, such that one exposure of the substrate to etching chemistries removes both the second patterned hard mask and the conformal removable sealant layer. In some embodiments, operations 414a and 414b are performed with two different chemistries in two separate operations. Both embodiments are described in detail below.

Where operation 414a and operation 414b are performed in a single operation, the substrate is exposed to a chemistry capable of etching both the second patterned hard mask material and the conformal removable sealant layer. For example, if the second patterned hard mask material is a carbon-containing material and the conformal removable sealant layer is one or more layers of a tin-containing oxide (such as tin oxide) or tin-containing nitride (such as tin nitride) or both, etching can be performed by exposing the substrate to hydrogen in an ashing operation to simultaneously remove both the second patterned hard mask and the conformal removable sealant layer. The tin-containing oxide and/or tin-containing nitride layer forms a volatile metal hydride, whereby the hydrogen gas used to etch the second patterned hard mask and/or conformal removable sealant layer does not etch or damage the underlying dielectric material. Removal of both in a single operation reduces steps in a process flow to increase efficiency.

Where operation 414a and operation 414b are performed in two separate operations, the second patterned hard mask may be removed using one etching chemistry while the conformal removable sealant layer is removed using a different etching chemistry. This allows for tuning of the etching to, for example, increase etch rate of the second patterned hard mask using a harsher etch chemistry, as the conformal removable sealant layer protects underlying dielectric layer from damage or etch while the second patterned hard mask is being removed. For example, operation 414a may be etched using aerobic conditions while operation 414b is etched using anaerobic conditions. As an example, the second patterned hard mask may be etched using oxygen-containing plasma, which may be formed by generating a plasma in an oxygen-containing environment. The oxygen-containing environment may be formed by flowing one or more oxygen-containing gases, such as $O_3$, peroxides including $H_2O_2$, $O_2$, $H_2O$, alcohols such as methanol, ethanol, and isopropanol, NO, nitrous dioxide ($NO_2$) nitrous oxide ($N_2O$), carbon monoxide (CO) and carbon dioxide ($CO_2$). "Plasma" refers to a plasma ignited in a reaction chamber or remotely and brought into the reaction chamber. Plasmas can include the reactants described herein and may include other agents, for example, a carrier gas, or reactive species such as hydrogen gas. The reactants and other agents may be present in a reaction chamber when a plasma is struck, or a remote plasma may be flowed into a chamber where the reactants are present and/or the reactants and/or carrier gas may be ignited into a plasma remotely and brought into the reaction chamber. A "plasma" is meant to include any plasma known to be technologically feasible, including inductively-coupled plasmas and microwave surface wave plasmas. In various embodiments, the plasma is an in-situ plasma, such that the plasma is formed directly above the substrate surface in the chamber. The in-situ plasma may be ignited at a power per substrate area between about 0.2122 $W/cm^2$ and about 2.122 $W/cm^2$. For example, the power may range from about 600 W to about 6000 W for a chamber processing four 300 mm wafers. Plasmas processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas processes may be formed by one or more suitable methods other than capacitive coupling of an RF field to a gas. In some embodiments, the plasma is a remote plasma, such that the second reactant is ignited in a remote plasma generator upstream of the station, then delivered to the station where the substrate is housed.

The conformal removable sealant layer may be subsequently removed in operation 414b. Where the conformal removable sealant layer is one or more layers of a tin-containing oxide and/or tin-containing nitride, the conformal removable sealant layer is removed using hydrogen-containing chemistry, such as hydrogen gas. Where the conformal removable sealant layer is one or more layers of a lead-containing oxide and/or lead-containing nitride, the conformal removable sealant layer is removed using a weak acid, such as an acid having a pKa between about −2 and about 12. A weak acid may be an organic acid. Examples of weak acids include acetic acid and citric acid. Such etch chemistries are mild enough to prevent etching and/or damage of underlying dielectric material.

FIG. 5G shows an example of a substrate with chamferless vias 546 whereby the second patterned hard mask and conformal removable sealant layers are removed, thereby resulting in chamferless vias 546. Note the elimination of the chamfer at 564.

Returning to FIG. 4, in operation 414c, the first patterned hard mask is removed. Where the first patterned hard mask is, for example, a titanium nitride layer deposited by physical vapor deposition, the mask may be removed using TK-10™ available from Entegris. In some embodiments, operations 414a, 414b, and 414c are performed simultaneously in one operation. This may be performed in some embodiments where the first patterned hard mask material is the same composition as the conformal removable sealant layer. in some embodiments the first patterned hard mask material may be a Group IV metal-containing oxide, Group IV metal-containing nitride, Group IV metal-containing sulfide, tin-containing oxide, tin-containing nitride, tin-containing sulfide, lead-containing oxide, lead-containing nitride, lead-containing sulfide, or any combination thereof. In some embodiments, the first patterned hard mask material has different composition than the conformal removable sealant layer, but both the first patterned hard mask material and the conformal removable sealant layer are materials such as Group IV metal-containing oxide, Group IV metal-containing nitride, Group IV metal-containing sulfide, tin-containing oxide, tin-containing nitride, lead-containing oxide, lead-containing nitride, or any combination thereof. An example whereby the first patterned hard mask material is the same as the conformal removable sealant layer material is described in further detail with respect to FIGS. 6A-6G below.

Figure 6A:
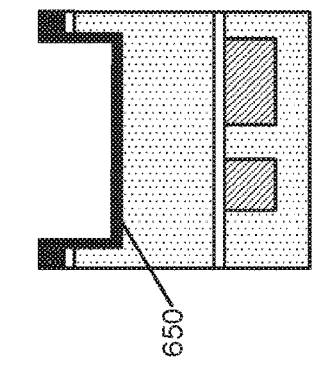
FIGS. 6A-6G are schematic illustrations of example substrates in various stages of processing performed in accordance with certain disclosed embodiments.

FIG. 6A shows an substrate 602 having metal lines 606a and an etch stop layer 604 underlying a first dielectric layer 608, liner layer 610, and patterned hard mask 612' whereby the patterned hard mask 612' is a Group IV metal-containing oxide, Group IV metal-containing nitride, Group IV metal-containing sulfide, tin-containing oxide, tin-containing nitride, tin-containing sulfide, lead-containing oxide, lead-containing nitride, lead-containing sulfide, or any combination thereof. In some embodiments, this may correspond to the providing of the substrate in operation 402 of FIG. 4.

Figure 6B:
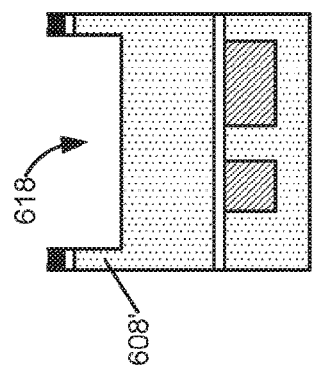

In FIG. 6B, the substrate 602 is exposed to an etch chemistry such as an oxygen-containing partially etch chemistry to etch the first dielectric layer 608 to form a second thinner dielectric layer 608' thereby forming a trench 618 to form a "trench level." In some embodiments, this may correspond to operation 404 of FIG. 4.

Figure 6C:
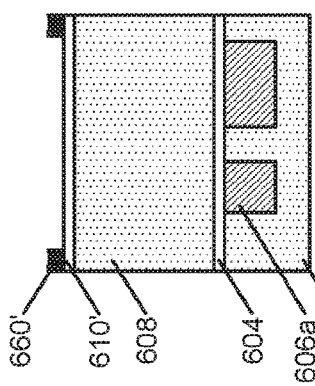

In FIG. 6C, a conformal removable sealant layer 650 is deposited over the substrate. In some embodiments, this may correspond to operation 406 of FIG. 4.

Figure 6D:
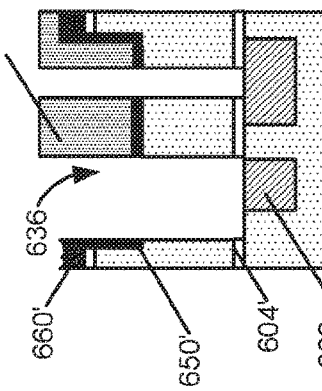

In FIG. 6D, a second patterned hard mask 624 is formed by depositing and patterning the hard mask material, which may be, for example, spin-on carbon. The hard mask is patterned to expose the conformal removable sealant layer 650 at the bottoms of vias 616. In some embodiments, this may correspond to operation 408 of FIG. 4.

Figure 6E:
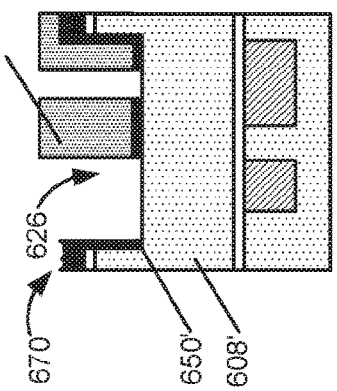

In FIG. 6E, the conformal removable sealant layer 650 is directionally etched to form etched conformal removable sealant layer 650' and open the surface underlying the conformal removable sealant layer to expose dielectric 608' at the bottoms of vias 626. Note in some embodiments, some erosion may occur at top 670 of hardmask, but the full thickness of the hardmask will not be removed. In some embodiments, this may correspond to operation 410 of FIG. 4.

Figure 6F:
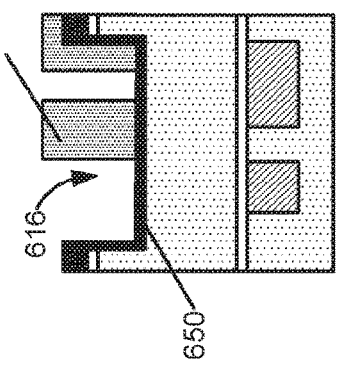

In FIG. 6F, the substrate is etched using the second patterned hard mask 624 as a mask, and the etch stop layer 604 is etched to form etched etch stop layer 604' thereby exposing the metal lines 606a and the exposed surface of dielectric 602. In some embodiments, this may correspond to operation 412 of FIG. 4.

Figure 6G:
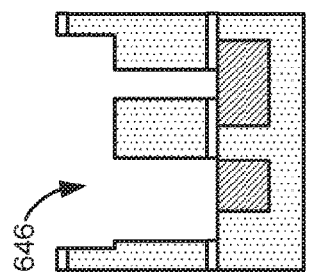

In FIG. 6G, the second patterned hard mask 624, conformal removable sealant layer 650', and first patterned hard mask 660' are all removed, which may be performed in one operation, such as using hydrogen gas, if the materials for all three are removable using hydrogen-containing etch chemistry. For example, one embodiment where all three may be etched simultaneously is where second patterned hard mask 624 is spin-on carbon, conformal removable sealant layer 650' is one or more layers of tin-containing oxide, tin-containing nitride, or both, and first patterned hard mask 660' is one or more layers of tin-containing oxide, tin-containing nitride, or both. In such case, the substrate may be exposed to hydrogen gas to remove the second patterned hard mask 624, conformal removable sealant layer 650', and first patterned hard mask 660' in one operation. In some embodiments, this may correspond to operations 414a, 414b, and 414c of FIG. 4.

In another example, the second patterned hard mask 624 may be removed using a first etching chemistry, and the conformal removable sealant layer 650' and first patterned hard mask 660' are etched using a second etching chemistry. For example, this may correspond to performing operation 414a as one operation and performing operations 414b and 414c as another, single operation. For example, the second patterned hard mask 624 may be spin-on carbon etched by oxygen-containing plasma, and the conformal removable sealant layer 650' and first patterned hard mask 660' may be etched using hydrogen-containing chemistry if both are tin-containing oxide, tin-containing nitride, or combinations thereof. In another example, the second patterned hard mask 624 may be spin-on carbon etched by oxygen-containing plasma, and the conformal removable sealant layer 650' and first patterned hard mask 660' may be etched using a weak organic acid chemistry if both are lead-containing oxide, lead-containing nitride, or combinations thereof.

In another example, the second patterned hard mask 624 may be removed using a first etching chemistry, the conformal removable sealant layer 650' is etched using a second etching chemistry, and the first patterned hard mask 660' is etched using a third etching chemistry. For example, the second patterned hard mask 624 may be spin-on carbon etched by oxygen-containing plasma, and the conformal removable sealant layer 650' may be tin-containing oxide, tin-containing nitride, or combinations thereof etched using hydrogen-containing chemistry, and first patterned hard mask 660' may be lead-containing oxide, lead-containing nitride, or combinations thereof etched using a weak organic acid chemistry. In another example, the second patterned hard mask 624 may be spin-on carbon etched by oxygen-containing plasma, and the conformal removable sealant layer 650' may be lead-containing oxide, lead-containing nitride, or combinations thereof etched using a weak organic acid chemistry, and first patterned hard mask 660' may be tin-containing oxide, tin-containing nitride, or combinations thereof etched using hydrogen-containing chemistry.

Apparatus

Figure 7:
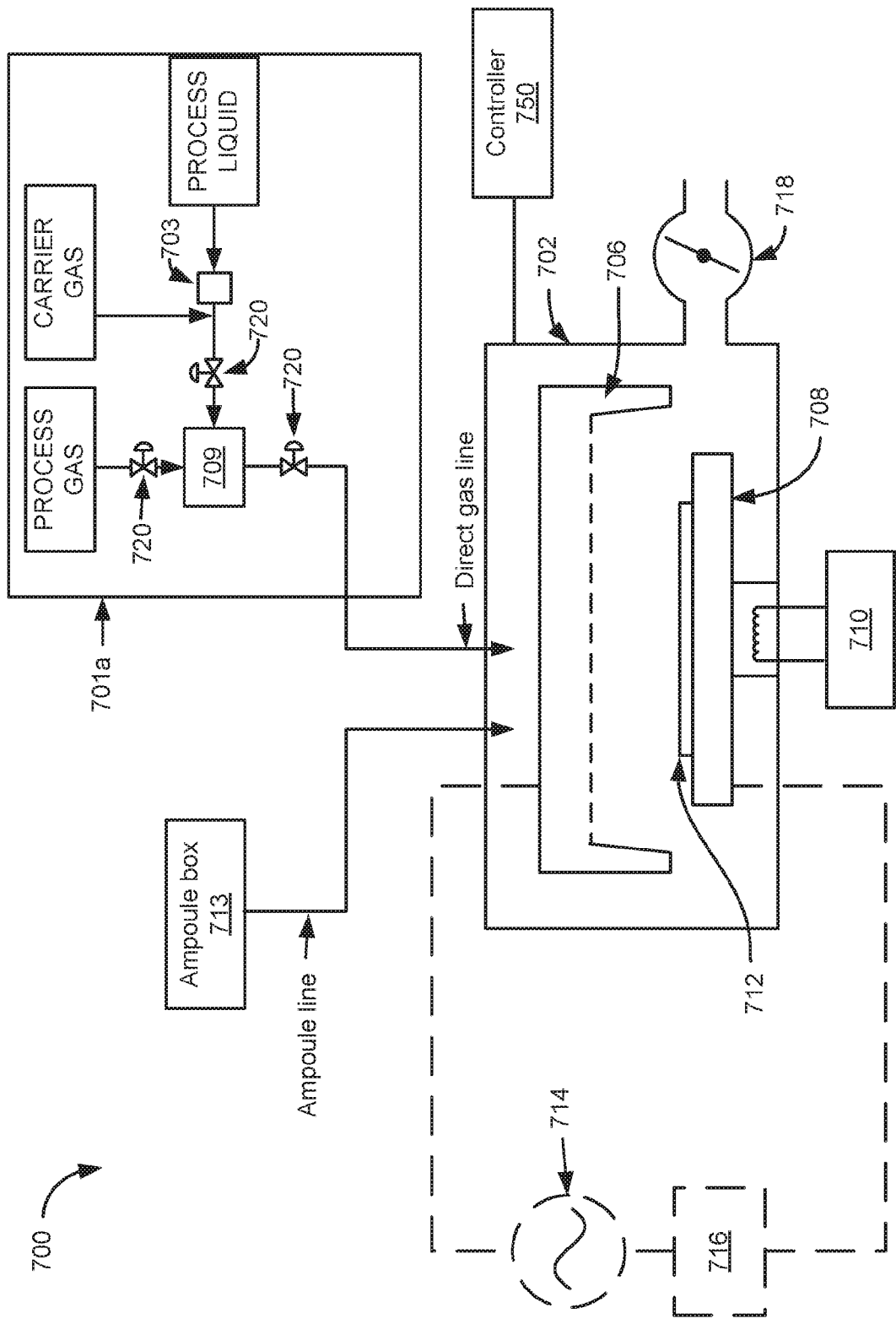
FIG. 7 is a schematic diagram of an example process station for performing disclosed embodiments.
Figure 8:
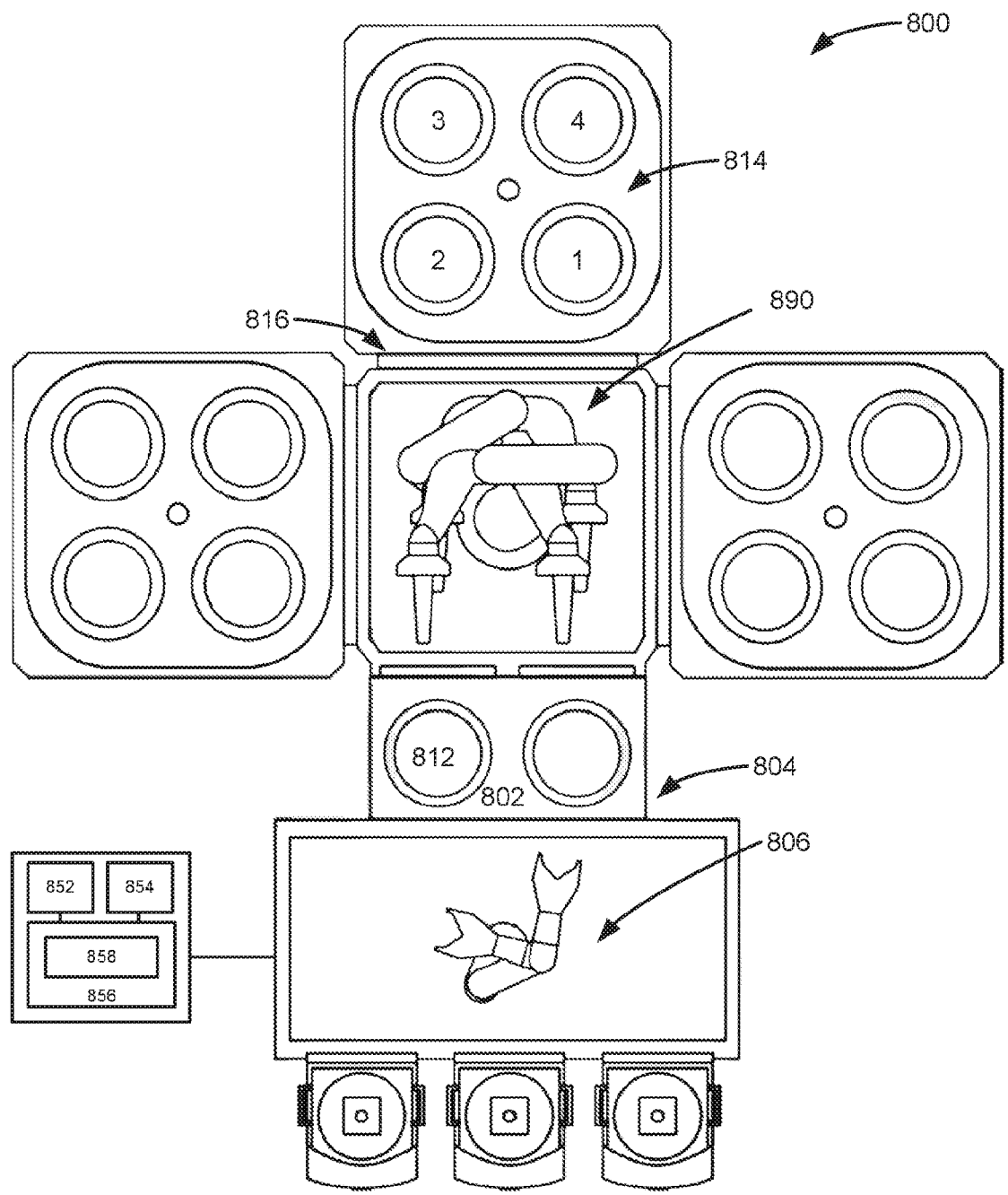
FIG. 8 is a schematic diagram of an example process tool for performing disclosed embodiments.

FIG. 7 depicts a schematic illustration of an embodiment of deposition process station 700 having a process chamber body 702 for maintaining a low-pressure environment. A plurality of process stations 700 may be included in a common low pressure process tool environment. For example, FIG. 8 depicts an embodiment of a multi-station processing tool 800. In some embodiments, one or more hardware parameters of process station 700, including those discussed in detail below, may be adjusted programmatically by one or more computer controllers 750.

Process station 700 fluidly communicates with reactant delivery system 701 for delivering process gases to a distribution showerhead 706. Reactant delivery system 701 includes a mixing vessel 704 for blending and/or conditioning process gases for delivery to showerhead 706. One or more mixing vessel inlet valves 720 may control introduction of process gases to mixing vessel 704.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712. Example process gases include soak gases, removable sealant layer precursor gases, oxygen-containing or nitrogen-containing reactant gases, and carrier gases or purge gases.

In some embodiments, a microvolume 707 is located beneath showerhead 706. Practicing disclosed embodiments in a microvolume rather than in the entire volume of a process station may reduce reactant exposure and purge times, may reduce times for altering process conditions (e.g., pressure, temperature, etc.) may limit an exposure of process station robotics to process gases, etc. Example microvolume sizes include, but are not limited to, volumes between 0.1 liter and 2 liters. This also impacts productivity throughput. In some embodiments, the disclosed embodiments are not performed in a microvolume.

In some embodiments, pedestal 708 may be raised or lowered to expose substrate 712 to microvolume 707 and/or to vary a volume of microvolume 707. For example, in a substrate transfer phase, pedestal 708 may be raised to position substrate 712 within microvolume 707. In some embodiments, microvolume 707 may completely enclose substrate 712 as well as a portion of pedestal 708 to create a region of high flow impedance.

Optionally, pedestal 708 may be lowered and/or raised during portions the process to modulate process pressure, reactant concentration, etc., within microvolume 707. In one scenario where process chamber body 702 remains at a base pressure during the process, lowering pedestal 708 may allow microvolume 707 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller 750.

In another scenario, adjusting a height of pedestal 708 may allow a plasma density to be varied during plasma activation and/or treatment cycles included in the process. At the conclusion of the process phase, pedestal 708 may be lowered during another substrate transfer phase to allow removal of substrate 712 from pedestal 708.

While the example microvolume variations described herein refer to a height-adjustable pedestal, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In some embodiments where plasma may be used as discussed above, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Examples of suitable powers are included above. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz, for example 2 MHz, 13.56 MHz, or 27 MHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., Group IV metal-containing precursor), instructions for setting a flow rate of a carrier gas, instructions for setting a pedestal temperature, and time delay instructions for the first recipe phase. A second, subsequent recipe phase may include instructions for modulating or stopping a flow rate of an inert and/or a reactant gas, instructions for modulating a flow rate of a carrier or purge gas and time delay instructions for the second recipe phase. A third recipe phase may include instructions for setting a flow rate of an inert and/or reactant gas (e.g., oxygen-containing or nitrogen-containing reactant), instructions for modulating a flow rate of a carrier gas, and time delay instructions for the third recipe phase. A fourth recipe phase may include instructions for modulating or stopping a flow rate of an inert and/or a reactant gas, instructions for modulating the flow rate of a carrier or purge gas, and time delay instructions for the fourth recipe phase. It will be appreciated that these recipe phases may be further subdivided and/or iterated in any suitable way within the scope of the present disclosure.

In some embodiments, pedestal 708 may be temperature controlled via heater 710. The pedestal may be set to a deposition temperature. For example, the pedestal may be set to a temperature between about 200° C. and about 300° C. for deposition of a nitride or carbide. Further, in some embodiments, pressure control for process station 700 may be provided by butterfly valve 718. As shown in the embodiment of FIG. 7, butterfly valve 718 throttles a vacuum provided by a downstream vacuum pump (not shown). In some embodiments, butterfly valve 718 acts as an outlet for coupling to a vacuum. However, in some embodiments, pressure control of process station 700 may also be adjusted by varying a flow rate of one or more gases introduced to the process station 700.

As described above, one or more process stations may be included in a multi-station processing tool. FIG. 8 shows a schematic view of an embodiment of a multi-station processing tool 800 with an inbound load lock 802 and an outbound load lock 804, either or both of which may comprise a remote plasma source. A robot 806, at atmospheric pressure, is configured to move substrates or wafers from a cassette loaded through a pod 808 into inbound load lock 802 via an atmospheric port 810. A substrate is placed by the robot 806 on a pedestal 812 in the inbound load lock 802, the atmospheric port 810 is closed, and the load lock is pumped down. Where the inbound load lock 802 comprises a remote plasma source, the substrate may be exposed to a remote plasma treatment in the load lock prior to being introduced into a processing chamber 814. Further, the substrate also may be heated in the inbound load lock 802 as well, for example, to remove moisture and adsorbed gases. Next, a chamber transport port 816 to processing chamber 814 is opened, and another robot (not shown) places the substrate into the reactor on a pedestal of a first station shown in the reactor for processing. While the embodiment depicted in FIG. 8 includes load locks, it will be appreciated that, in some embodiments, direct entry of a substrate into a process station may be provided. In various embodiments, the soak gas is introduced to the station when the substrate is placed by the robot 806 on the pedestal 812.

The depicted processing chamber 814 comprises four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALD and PEALD process mode. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring substrates within processing chamber 814. In some embodiments, wafer handling system 890 may transfer substrates between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc. In some embodiments, system controller 850 includes machine-readable instructions for performing operations such as those described above with respect to FIGS. 2, 3, and 4.

In some embodiments, system controller 850 controls the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, amount of gas flow, chamber and/or station pressure, chamber and/or station temperature, substrate temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., first precursor gas, soak gas, second reactant gas, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as the soak gas) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes such as processes that employ a soak prior to initiating ALD for a substrate inserted into the reaction chamber, with the soak performed under any of the soak conditions described herein. The program instructions may control a variety of process parameters, such as direct current (DC) power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399, filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or ultraviolet (UV) curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   providing a substrate having a trench formed in a dielectric material;
   depositing a selectively removable sealant layer conformally in the trench,
   wherein the selectively removable sealant layer comprises a Group IV metal;
   forming a patterned hard mask on the selectively removable sealant layer;
   etching the dielectric material using the patterned hard mask; and
   removing the patterned hard mask and the selectively removable sealant layer to produce a chamferless via.

2. The method of claim 1, wherein the Group IV metal is selected from the group consisting of tin and lead.

3. The method of claim 1, wherein the selectively removable sealant layer is selected from the group consisting of tin oxide, tin nitride, tin sulfide, lead oxide, lead nitride, lead sulfide, and combinations thereof; and wherein the selectively removable sealant layer comprises one or more than one layer.

4. The method of claim 1, further comprising:
   selectively removing the selectively removable sealant layer relative to the dielectric material using hydrogen gas or an organic acid.

5. The method of claim 1, wherein the trench comprises an opening and a bottom, and a distance from the opening to the bottom is at least about 25% of a total thickness of the dielectric material.

6. The method of claim 1, wherein the substrate further comprises a metal hard mask over the dielectric material.

7. The method of claim 1, wherein the patterned hard mask is removable using a hydrogen-containing gas.

8. The method of claim 1, wherein the dielectric material is an ultra-low-k silicon oxide.

9. The method of claim 4, wherein the organic acid is selected from the group consisting of acetic acid and citric acid.

10. The method of claim 6, further comprising:
    selectively removing the metal hard mask relative to the dielectric material using a hydrogen-containing gas.

11. The method of claim 10, wherein the hydrogen-containing gas is selected from the group consisting of hydrogen ($H_2$), methane ($CH_4$), ethylene ($C_2H_4$), ammonia ($NH_3$), and mixtures thereof.

12. The method of claim 1, wherein the selectively removable sealant layer comprises two layers, and wherein the two layer optionally have different composition.

13. The method of claim 7, wherein the patterned hard mask comprises spin-on carbon.

14. A method, the method comprising:
providing a semiconductor substrate comprising a layer of material, a removable sealant layer on the layer of material, and a patterned hard mask directly on the removable sealant layer, the layer of material comprising dielectric material and a metal underlying the dielectric material;
selectively etching the removable sealant layer relative to the dielectric material to expose the dielectric material;
etching the dielectric material using the patterned hard mask to expose a surface of the metal; and
removing the patterned hard mask and the removable sealant layer completely to form a via exposing the surface of the metal.

15. The method of claim 14, wherein the etching the dielectric material comprises exposing the dielectric material to an oxygen-containing reactant.

16. The method of claim 14, wherein the selectively etching the removable sealant layer comprises applying a bias.

17. A method comprising:
providing a semiconductor substrate having a dielectric material comprising (i) a trench and a first patterned hard mask or (ii) a trench formed by a first patterned hard mask;
depositing a removable sealant layer conformally over the dielectric material, wherein the removable sealant layer comprises a Group IV metal;
forming a second patterned mask over the removable sealant layer;
etching the dielectric material using the second patterned mask;
selectively removing the second patterned mask relative to the removable sealant layer and dielectric material; and
selectively removing the removable sealant layer relative to the dielectric material.

18. The method of claim 17, wherein the selectively removing the second patterned mask and the selectively removing the removable sealant layer are performed using the same etching chemistry.

19. The method of claim 18, wherein the etching chemistry comprises a hydrogen-containing gas.

20. The method of claim 17, further comprising selectively removing the first patterned hard mask relative to other exposed surfaces on the semiconductor substrate.

21. The method of claim 20, wherein the selectively removing the removable sealant layer is performed using the same etching chemistry as the selectively removing the second patterned mask and/or selectively removing the first patterned hard mask.

22. The method of claim 21, wherein the etching chemistry comprises a hydrogen-containing gas.

23. A method comprising:
providing a substrate having dielectric disposed over a metal surface;
etching the dielectric to form a via to the metal surface; and
bifurcating the etch of the dielectric by:
etching a first amount of the dielectric to form a trench, wherein the first amount of the dielectric etched is between about 50% and about 75% of a total thickness of the dielectric,
etching a second amount of the dielectric to expose the metal surface, and
depositing a removable sealant layer over the dielectric, patterning a hard mask over the removable sealant layer, between a time of the etching the first amount of the dielectric and a time of the etching the second amount of the dielectric.

24. The method of claim 23, wherein the removable sealant layer comprises tin nitride deposited using anaerobic conditions, a tin oxide, or an underlayer of tin nitride and a top layer of tin oxide; and wherein the removable sealant layer comprises one or more than one layer.

25. The method of claim 17, comprising, after the forming the second patterned mask:
selectively etching the removable sealant layer by exposing the removable sealant layer to a hydrogen-containing gas and applying a bias; and
wherein the selectively removing the second patterned mask and the selectively removing the removable sealant layer uses a hydrogen-containing gas.

26. An apparatus comprising:
(a) a process chamber comprising a pedestal for holding a substrate;
(b) at least one outlet for coupling to a vacuum; and
(c) a controller for controlling operations in the apparatus, comprising machine-readable instructions for:
(i) causing introduction of a Group IV metal-containing precursor and a carbon-based layer over a layer formed using the Group IV metal-containing precursor over a dielectric material;
(ii) causing introduction of an oxygen-containing or nitrogen-containing reactant to selectively remove the dielectric material using the carbon-based layer; and
(iii) causing introduction of a hydrogen-containing gas to remove the carbon-based layer.

27. The apparatus of claim 26, wherein:
the layer formed using the Group IV metal-containing precursor comprises a selectively removable sealant layer formed over the dielectric material; and
the carbon-based layer comprises a patterned hard mask.

* * * * *